United States Patent
Doong et al.

(10) Patent No.: US 11,263,755 B2
(45) Date of Patent: Mar. 1, 2022

(54) ALERT DEVICE AND ALERT METHOD THEREOF

(71) Applicant: NANYA TECHNOLOGY CORPORATION, New Taipei (TW)

(72) Inventors: Shyue-Ru Doong, New Taipei (TW); Feng-Ju Tsai, Zhubei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 47 days.

(21) Appl. No.: 16/932,399

(22) Filed: Jul. 17, 2020

(65) Prior Publication Data
US 2022/0020157 A1 Jan. 20, 2022

(51) Int. Cl.
*G06K 9/00* (2006.01)
*G06T 7/13* (2017.01)
*G06T 7/00* (2017.01)
*H01L 21/67* (2006.01)

(52) U.S. Cl.
CPC .............. *G06T 7/13* (2017.01); *G06T 7/0006* (2013.01); *H01L 21/67259* (2013.01); *G06T 2207/30148* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,275,742 B1* | 8/2001 | Sagues | .................. | H01L 21/681 414/936 |
| 11,094,569 B2* | 8/2021 | Sato | .................... | H01L 21/6708 |
| 2003/0030050 A1* | 2/2003 | Choi | ....................... | G03F 7/168 257/4 |
| 2004/0095575 A1* | 5/2004 | Woo | .................... | G01N 21/9501 356/300 |
| 2005/0276920 A1* | 12/2005 | Kim | .................. | H01L 21/67259 427/240 |
| 2010/0271229 A1* | 10/2010 | Allen-Blanchette | ........................ | H01L 21/681 340/815.4 |
| 2012/0195490 A1* | 8/2012 | Langmans | ............ | G06T 7/0004 382/149 |
| 2013/0016346 A1* | 1/2013 | Romanovsky | ..... | G01N 21/8806 356/237.5 |
| 2015/0214085 A1* | 7/2015 | Jin | .................... | H01L 21/67706 414/806 |
| 2016/0329229 A1* | 11/2016 | Sun | .................... | H01L 21/68764 |
| 2017/0350696 A1* | 12/2017 | Du | ........................ | G03F 9/7011 |

(Continued)

*Primary Examiner* — Shervin K Nakhjavan
(74) *Attorney, Agent, or Firm* — Muncy, Geissler, Olds & Lowe, P.C.

(57) ABSTRACT

The present disclosure provides an alert device and an alert method. The alert device includes an image capturing unit, an input/output unit and a processing unit. The image capturing unit is configured to capture at least one image of a wafer transportation system. The processing unit is configured to: retrieve the at least one image from the image capturing unit; define a first boundary in the at least one image; identify a wafer chuck of the wafer transportation system in the at least one image; determine whether the wafer chuck intersects the first boundary in the at least one image; and transmit an alert signal to the wafer transportation system via the input/output unit when the wafer chuck is determined to intersect the first boundary in the at least one image.

20 Claims, 25 Drawing Sheets

(56) References Cited

U.S. PATENT DOCUMENTS

2019/0325601 A1* 10/2019 Chen .................... G06T 7/80
2020/0013657 A1* 1/2020 Lee .................. H01L 21/67259

* cited by examiner

ALERT DEVICE AND ALERT METHOD THEREOF

TECHNICAL FIELD

The present disclosure relates to an alert device and an alert method thereof, and more particularly, to an alert device and an alert method thereof for a wafer transportation system.

DISCUSSION OF THE BACKGROUND

In the semiconductor industry, technologies of automated wafer transportation are introduced. However, during the automatic transportation of wafers, damage to the wafer may be caused if the wafer transportation apparatus is not operated smoothly. Accordingly, to prevent the wafer from being damaged during the automatic transportation, a device and a method for detecting the possible failures and alerting the wafer transportation apparatus are needed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides an alert device, including an image capturing unit, an input/output unit and a processing unit. The image capturing unit is configured to capture at least one image of a wafer transportation system. The input/output unit is configured to communicate with the wafer transportation system. The processing unit is connected to the input/output unit and the image capturing unit electrically, and configured to: retrieve the at least one image from the image capturing unit; define a first boundary in the at least one image; identify a wafer chuck of the wafer transportation system in the at least one image; determine whether the wafer chuck intersects the first boundary in the at least one image; and transmit an alert signal to the wafer transportation system via the input/output unit when the wafer chuck is determined to intersect the first boundary in the at least one image.

In some embodiments, the processing unit is further configured to: define a second boundary in the at least one image; determine whether the wafer chuck intersects the second boundary in the at least one image; and transmit the alert signal to the wafer transportation system via the input/output unit when the wafer chuck is determined to intersect the second boundary in the at least one image.

In some embodiments, determining whether the wafer chuck intersects the first boundary in the at least one image further includes: determining edges of the wafer chuck; and determining whether the edges of the wafer chuck intersect the first boundary in the at least one image.

In some embodiments, the first boundary includes a first line in a first direction and a second line in a second direction, which is different from the first direction.

In some embodiments, identifying the wafer chuck of the wafer transportation system in the at least one image further includes: identifying the wafer chuck of the wafer transportation system in the at least one image according to a mark, a color or a shape of the wafer chuck.

In some embodiments, the input/output unit is further configured to receive an input data from a user, and the first boundary is defined according to the input data.

In some embodiments, the alert signal is used to stop the wafer transportation system from transporting the wafer chuck.

Another aspect of the present disclosure provides an alert device, including an image capturing unit, an input/output unit and a processing unit. The image capturing unit is configured to capture at least one image of a monitor, wherein the monitor displays a wafer transportation system and a first boundary. The input/output unit is configured to communicate with the wafer transportation system. The processing unit is connected to the input/output unit and the image capturing unit electrically, and configured to: retrieve the at least one image from the image capturing unit; identify a wafer chuck of the wafer transportation system and the first boundary in the at least one image; determine whether the wafer chuck intersects the first boundary in the at least one image; and transmit an alert signal to the wafer transportation system via the input/output unit when the wafer chuck is determined to intersect the first boundary in the at least one image.

In some embodiments, the monitor further displays a second boundary. The processing unit is further configured to: identify the second boundary in the at least one image; determine whether the wafer chuck intersects the second boundary in the at least one image; and transmit the alert signal to the wafer transportation system via the input/output unit when the wafer chuck is determined to intersect the second boundary in the at least one image.

In some embodiments, determining whether the wafer chuck intersects the first boundary in the at least one image further includes: determining edges of the wafer chuck; and determining whether the edges of the wafer chuck intersect the first boundary in the at least one image.

In some embodiments, the first boundary includes a first line in a first direction and a second line in a second direction, which is different from the first direction.

In some embodiments, identifying the wafer chuck of the wafer transportation system in the at least one image further includes: identifying the wafer chuck of the wafer transportation system in the at least one image according to a mark, a color or a shape of the wafer chuck.

In some embodiments, the alert signal is used to stop the wafer transportation system from transporting the wafer chuck.

Another aspect of the present disclosure provides an alert method, including: capturing, by an image capturing unit, at least one image of a wafer transportation system; defining, by a processing unit, a first boundary in the at least one image; identifying, by the processing unit, a wafer chuck of the wafer transportation system in the at least one image; determining, by the processing unit, whether the wafer chuck intersects the first boundary in the at least one image; and transmitting, by the processing unit, an alert signal to the wafer transportation system via an input/output unit communicating with the wafer transportation system when the wafer chuck is determined to intersect the first boundary in the at least one image.

In some embodiments, the alert method further includes: defining, by the processing unit, a second boundary in the at least one image; determining, by the processing unit, whether the wafer chuck intersects the second boundary in the at least one image; and transmitting, by the processing unit, the alert signal to the wafer transportation system via the input/output unit when the wafer chuck is determined to intersect the second boundary in the at least one image.

In some embodiments, determining whether the wafer chuck intersects the first boundary in the at least one image further includes: determining, by the processing unit, edges of the wafer chuck; and determining, by the processing unit, whether the edges of the wafer chuck intersect the first boundary in the at least one image.

In some embodiments, the first boundary includes a first line in a first direction and a second line in a second direction, which is different from the first direction.

In some embodiments, identifying the wafer chuck of the wafer transportation system in the at least one image further includes: identifying, by the processing unit, the wafer chuck of the wafer transportation system in the at least one image according to a mark, a color or a shape of the wafer chuck.

In some embodiments, the alert method further includes: receiving, by the input/output unit, an input data from a user; wherein the first boundary is defined according to the input data.

In some embodiments, the alert signal is used to stop the wafer transportation system from transporting the wafer chuck.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
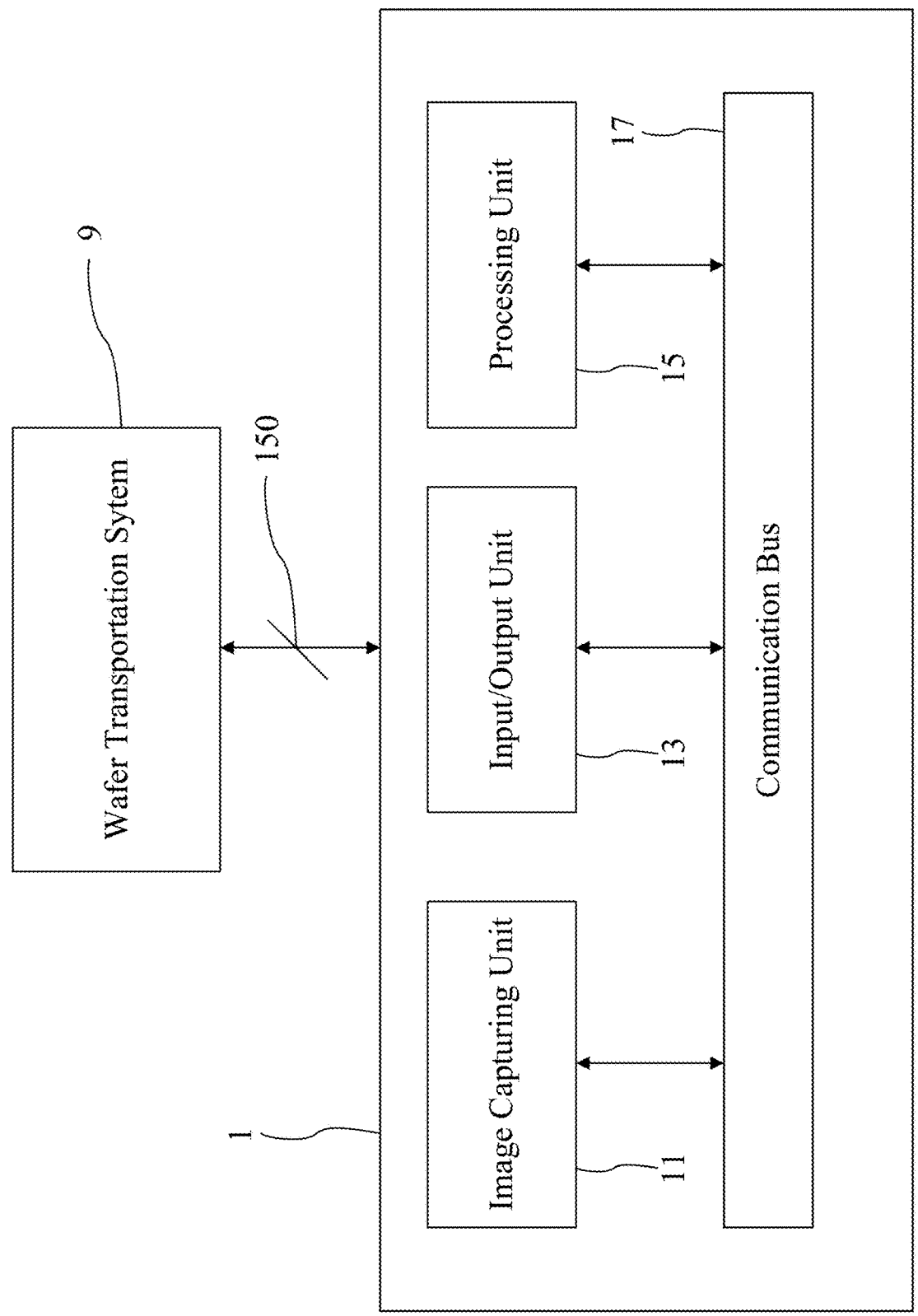
FIG. 1 is a block diagram of an alert device according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a block diagram of an alert device 1 according to some embodiments of the present disclosure. The alert device 1 may include an image capturing unit 11, an input/output unit 13 and a processing unit 15. The input/output unit 13 may communicate with a wafer transportation system 9. The image capturing unit 11, the input/output unit 13 and the processing unit 15 may be electrically connected through a communication bus 17, and the interactions therebetween will be further described below.

Figure 2:
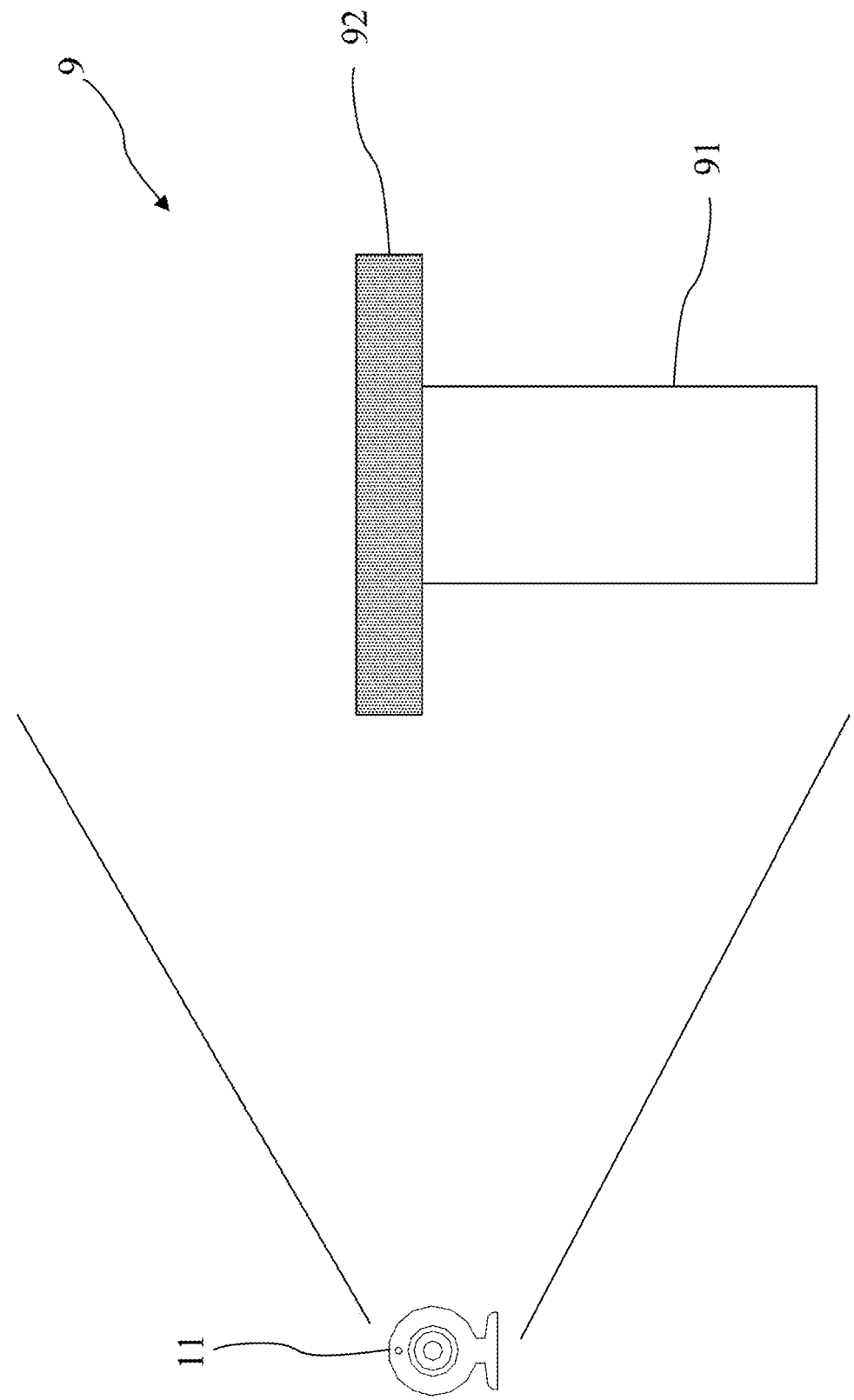
FIG. 2 is a schematic view of an image capturing unit capturing images of a wafer transportation system according to some embodiments of the present disclosure.

Please refer to FIG. 2, which is a schematic view of the image capturing unit 11 capturing images of the wafer transportation system 9 according to some embodiments of the present disclosure. Particularly, the wafer transportation system 9 may include a robot 91. The robot 91 may carry a wafer chuck 92 loaded with a wafer (not shown), and transport the wafer chuck 92. The image capturing unit 11 may capture images of the wafer transportation system 9 when the wafer transportation system 9 is transporting the wafer chuck 92.

Figure 3A:
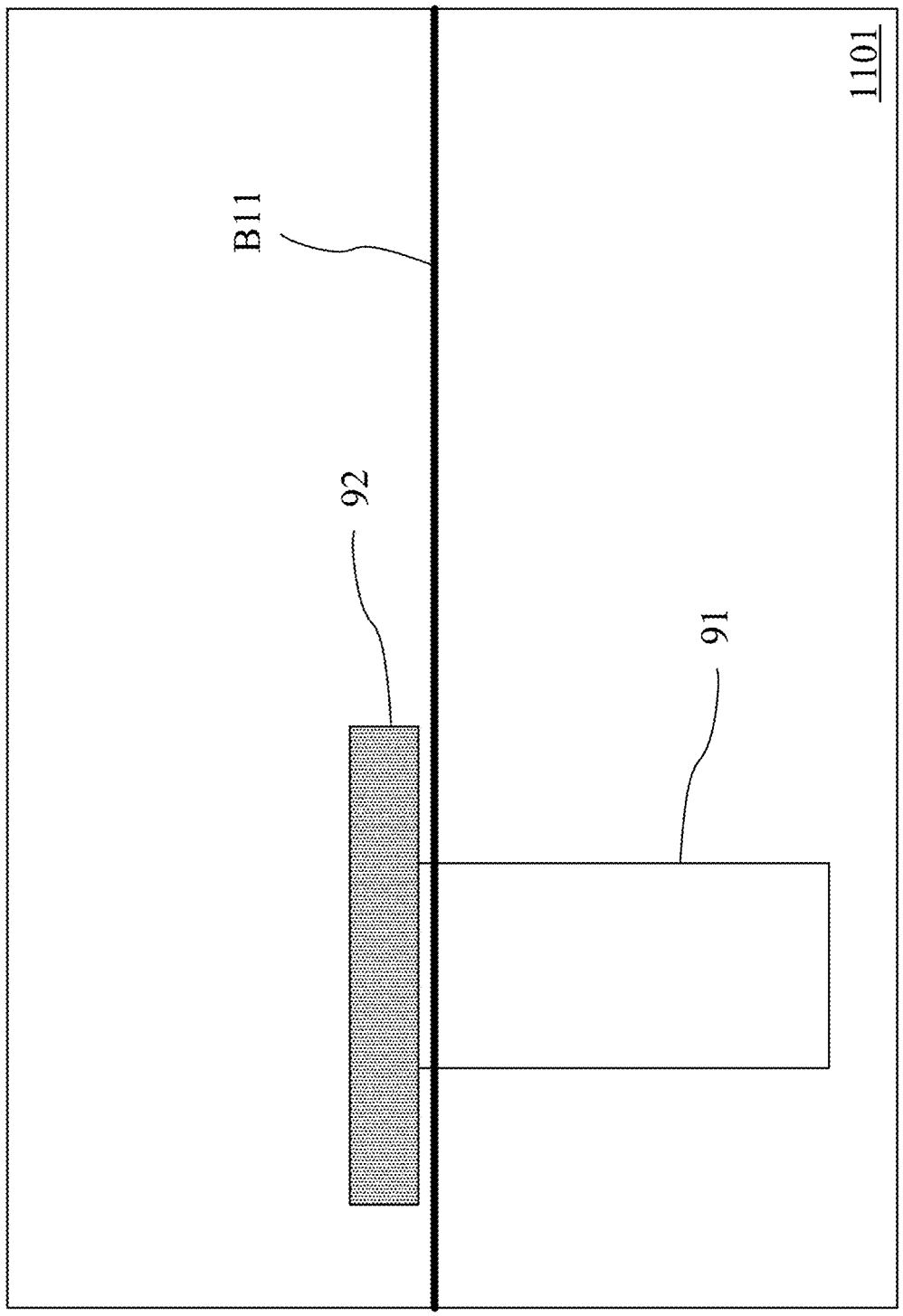
FIGS. 3A to 3D are schematic views of images of the wafer transportation system according to some embodiments of the present disclosure.

Please refer to FIG. 3A, which is a schematic view of an image of the wafer transportation system 9 according to some embodiments of the present disclosure. In detail, the image capturing unit 11 may capture an image 1101 of the wafer transportation system 9 at a time $T_{11}$. The processing unit 15 may retrieve the image 1101 from the image capturing unit 11 for further processing.

More specifically, after retrieving the image 1101, the processing unit 15 may define a first boundary B11 in the image 1101. Next, the processing unit 15 may identify the wafer chuck 92 of the wafer transportation system 9 in the image 1101, and determine whether the wafer chuck 92 intersects the first boundary B11 in the image 1101.

According to the image 1101, the processing unit 15 may determine that the wafer chuck 92 does not intersect the first boundary B11 in the image 1101. Accordingly, the image capturing unit 11 may continue capturing images of the wafer transportation system 9 during the transportation of the wafer chuck 92.

Figure 3B:
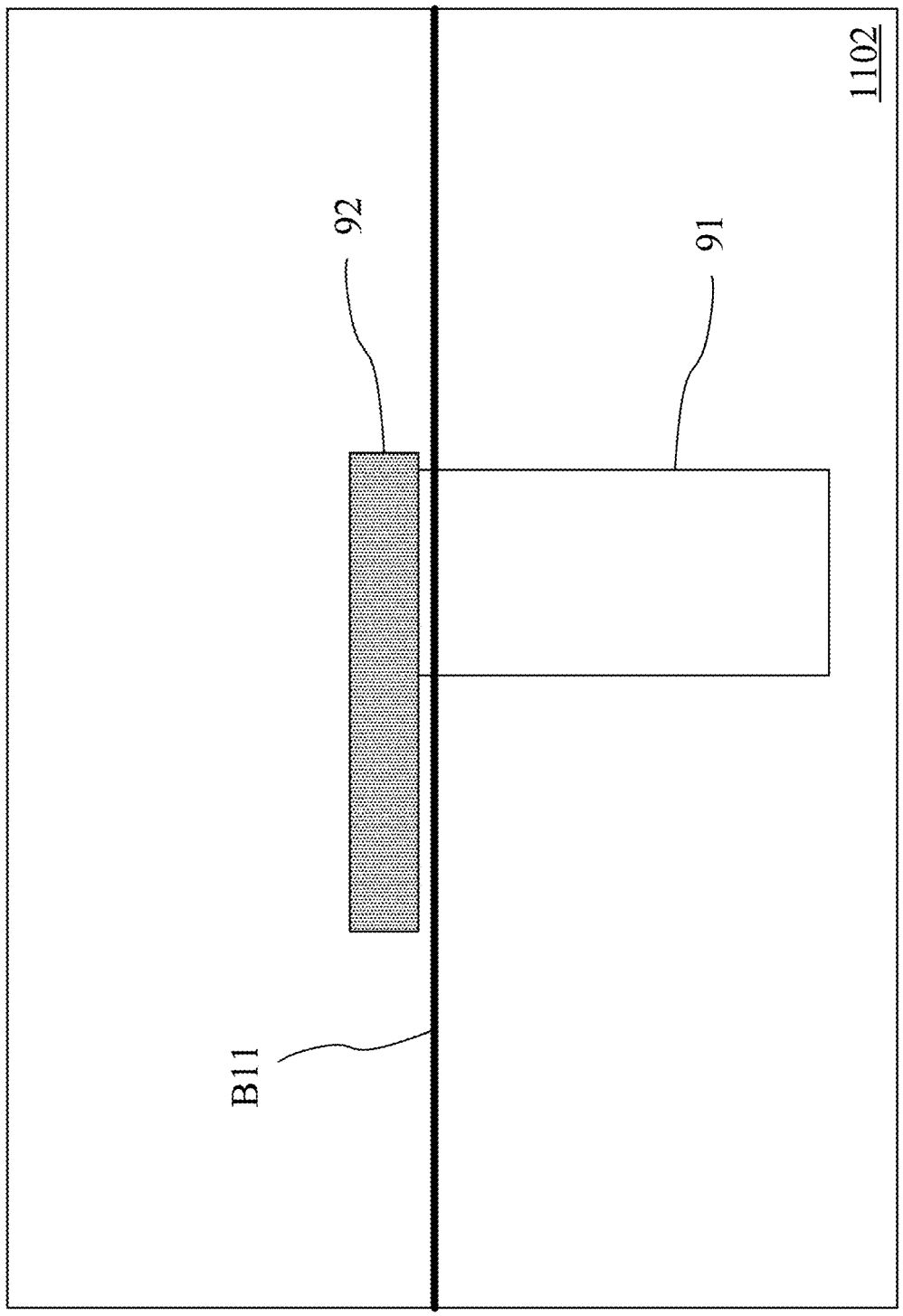

Please refer to FIG. 3B, which is a schematic view of an image of the wafer transportation system 9 according to some embodiments of the present disclosure. In detail, the image capturing unit 11 may capture an image 1102 of the wafer transportation system 9 at a time $T_{12}$. The processing unit 15 may retrieve the image 1102 from the image capturing unit 11 for further processing.

More specifically, after retrieving the image 1102, the processing unit 15 may define the first boundary B11 in the image 1102. It should be noted that, in some embodiments, the images 1101 and 1102 may have the same size, and the first boundary B11 may be defined at the same location in the images 1101 and 1102.

Next, the processing unit 15 may identify the wafer chuck 92 of the wafer transportation system 9 in the image 1102, and determine whether the wafer chuck 92 intersects the first boundary B11 in the image 1102.

According to the image 1102, although the wafer chuck 92 is slightly offset from the robot 91, the wafer chuck 92 is still balanced on the robot 91. Accordingly, the processing unit 15 may still determine that the wafer chuck 92 does not intersect the first boundary B11 in the image 1102, which means that the transportation of the wafer chuck 92 is still not interrupted. Accordingly, the image capturing unit 11 may continue capturing images of the wafer transportation system 9 during the transportation of the wafer chuck 92.

Figure 3C:
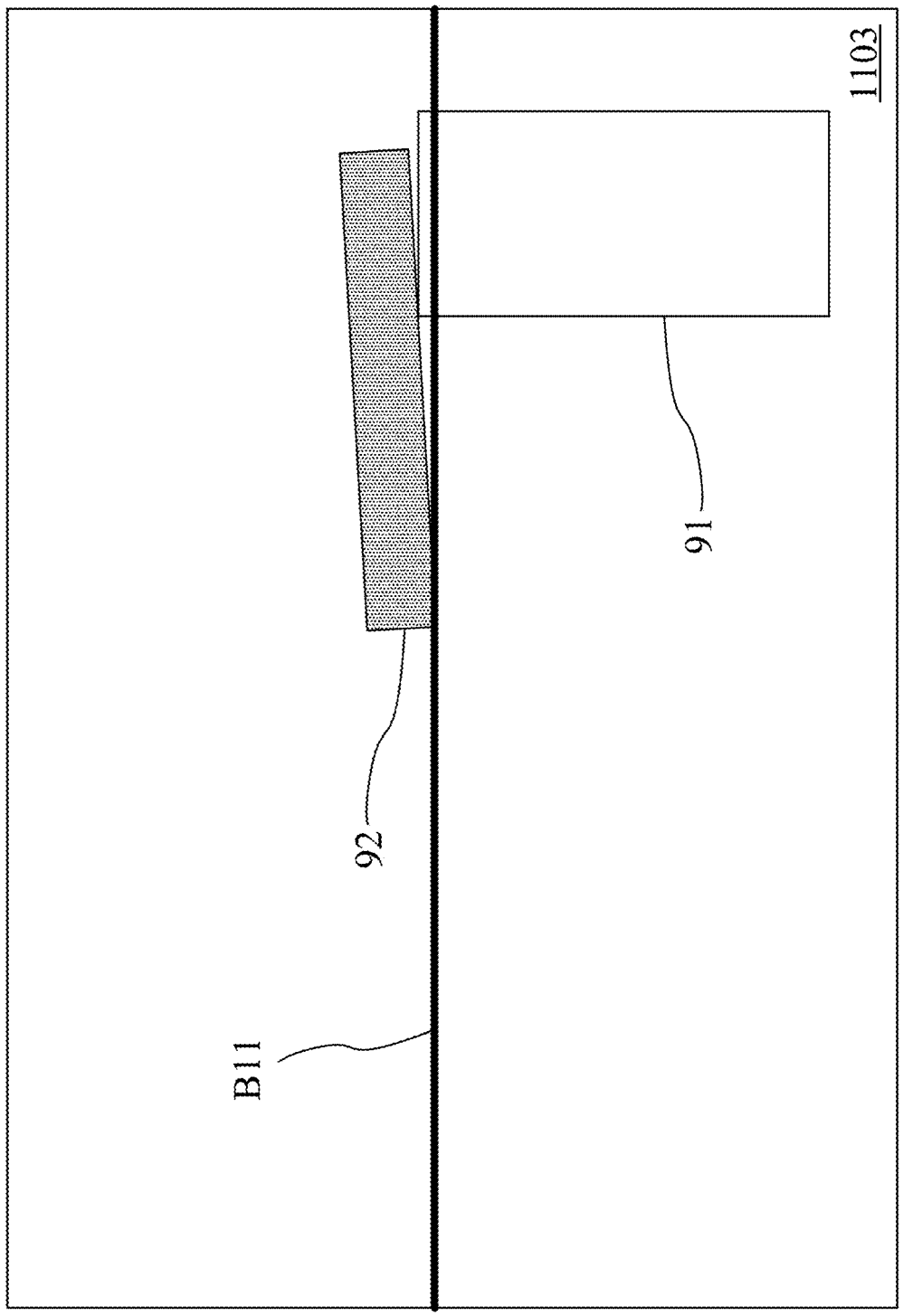

Please refer to FIG. 3C, which is a schematic view of an image of the wafer transportation system 9 according to some embodiments of the present disclosure. In detail, the image capturing unit 11 may capture an image 1103 of the wafer transportation system 9 at a time $T_{13}$. The processing unit 15 may retrieve the image 1103 from the image capturing unit 11 for further processing.

More specifically, after retrieving the image 1103, the processing unit 15 may define the first boundary B11 in the image 1103. It should be noted that, in some embodiments, the images 1101 to 1103 may have the same size, and the first boundary B11 may be defined at the same location in the images 1101 to 1103.

Next, the processing unit 15 may identify the wafer chuck 92 of the wafer transportation system 9 in the image 1103, and determine whether the wafer chuck 92 intersects the first boundary B11 in the image 1103.

According to the image 1103, the wafer chuck 92 may be mispositioned on the robot 91, and the processing unit 15 may determine that the wafer chuck 92 intersects the first boundary B11 in the image 1103, and, as a result, the transportation of the wafer chuck 92 will be stopped. Accordingly, the processing unit 15 may transmit an alert signal 150 to the wafer transportation system 9 via the input/output unit 13.

Subsequently, in some embodiments, to prevent the wafer loaded in the wafer chuck 92 from being damaged during the automatic transportation, the wafer transportation system 9 may stop the transportation of the wafer chuck 92 according to the alert signal 150.

Figure 3D:
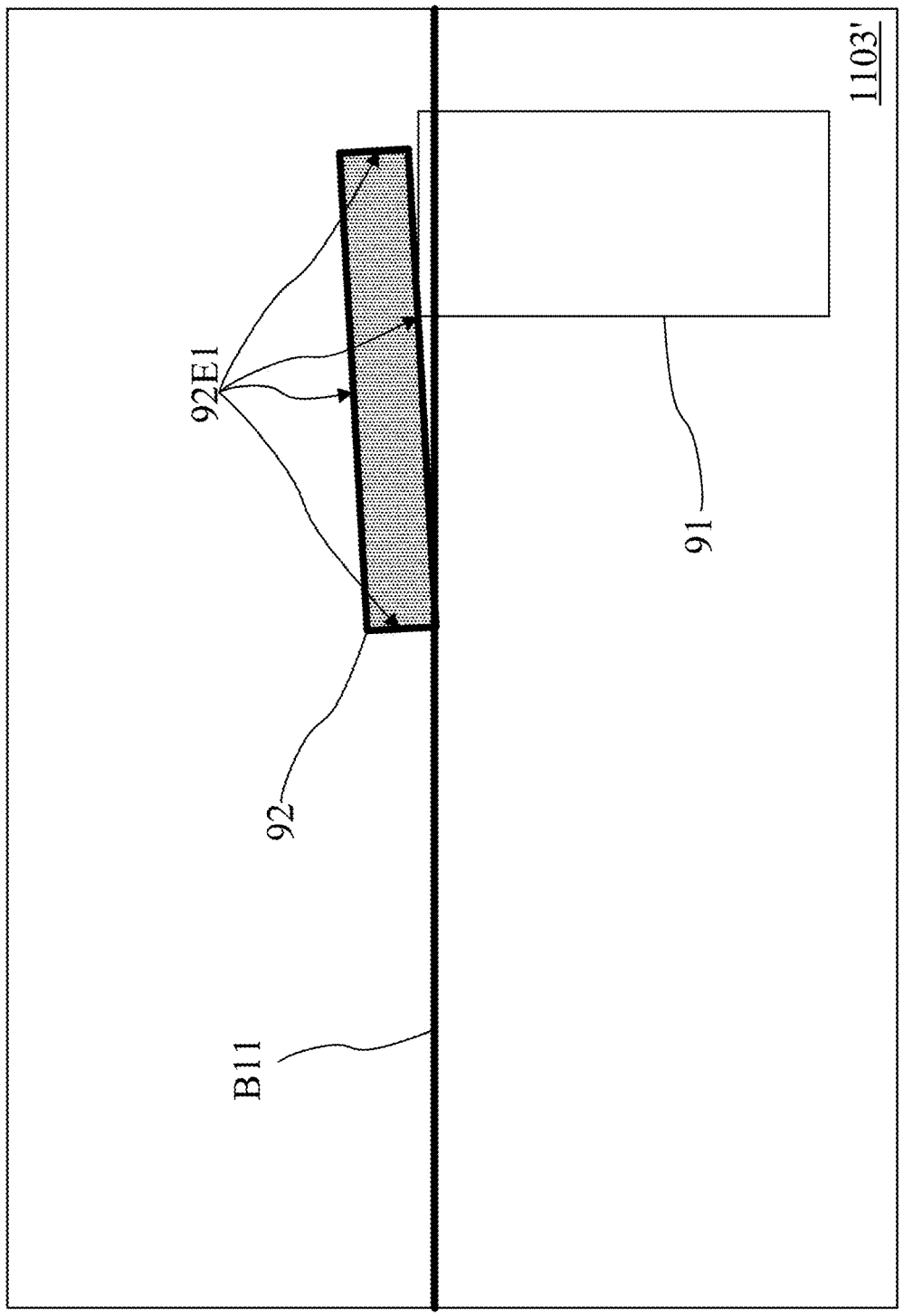

In some embodiments, edges of the wafer chuck 92 may be used for determining whether the wafer chuck 92 intersects the first boundary B11 in captured images. Please refer to FIG. 3D, which is a schematic view of an image of the wafer transportation system 9 according to some embodiments of the present disclosure. In detail, the image capturing unit 11 may capture an image 1103' of the wafer transportation system 9 at a time $T_{13}'$. The processing unit 15 may retrieve the image 1103' from the image capturing unit 11 for further processing.

More specifically, after retrieving the image 1103', the processing unit 15 may define the first boundary B11 in the image 1103'. It should be noted that, in some embodiments, the images 1101 to 1103' may have the same size, and the first boundary B11 may be defined at the same location in the images 1101 to 1103'.

Next, the processing unit 15 may identify the wafer chuck 92 of the wafer transportation system 9 in the image 1103'. Further, the processing unit 15 may determine edges 92E1 of the wafer chuck 92, and then determine whether the edge 92E1 of the wafer chuck 92 intersects the first boundary B11 in the image 1103'.

According to the image 1103', the wafer chuck 92 may be mispositioned on the robot 91, and the processing unit 15 may determine that the edge 92E1 of the wafer chuck 92 intersects the first boundary B11 in the image 1103', and, as a result, the transportation of the wafer chuck 92 will be stopped. Accordingly, the processing unit 15 may transmit the alert signal 150 to the wafer transportation system 9 via the input/output unit 13.

Subsequently, in some embodiments, to prevent the wafer loaded in the wafer chuck 92 from being damaged during the automatic transportation, the wafer transportation system 9 may stop the transportation of the wafer chuck 92 according to the alert signal 150.

Figure 4A:
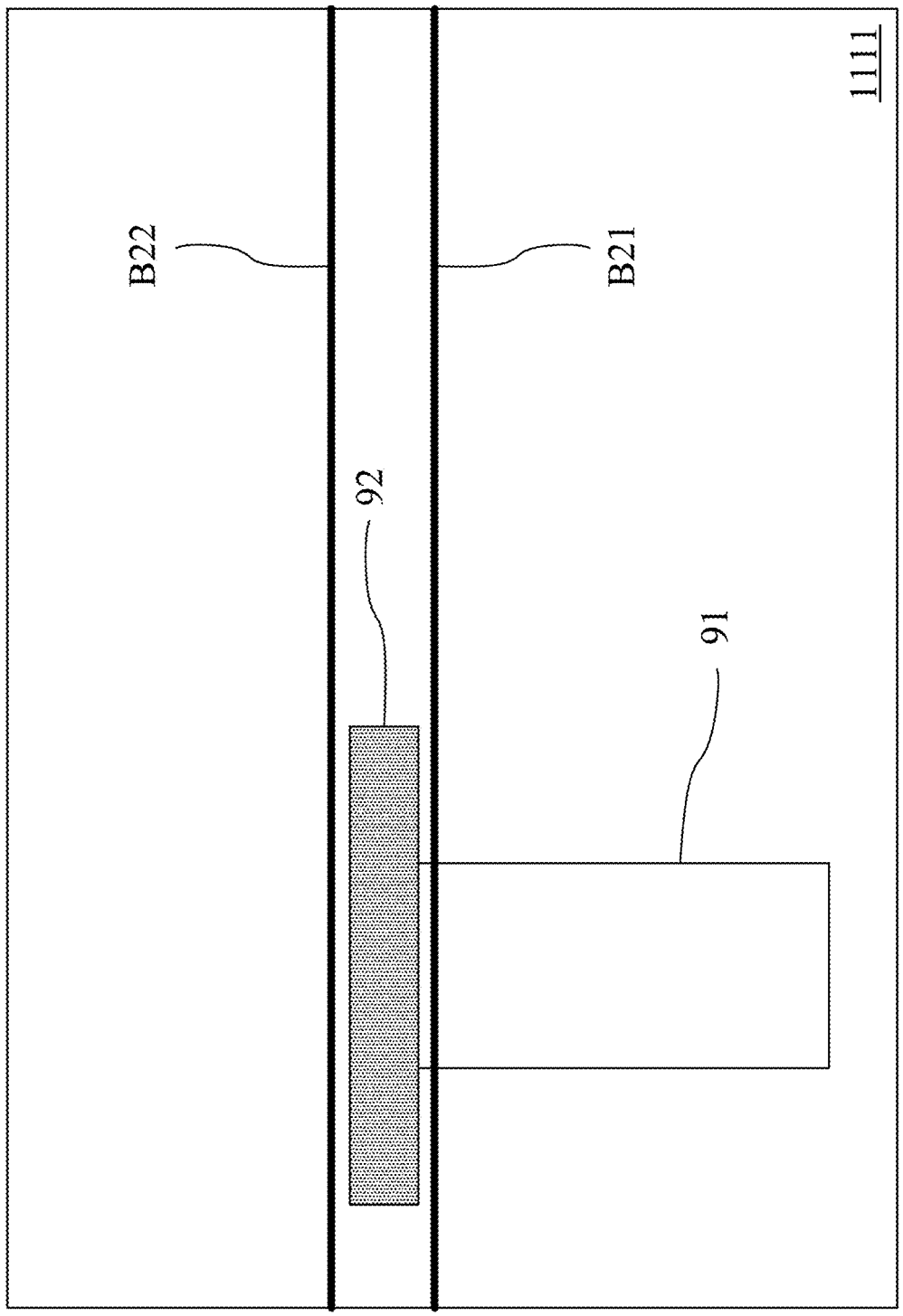
FIGS. 4A to 4C are schematic views of images of the wafer transportation system according to some embodiments of the present disclosure.

Please refer to FIG. 4A, which is a schematic view of an image of the wafer transportation system 9 according to some embodiments of the present disclosure. In detail, the image capturing unit 11 may capture an image 1111 of the wafer transportation system 9 at a time $T_{21}$. The processing unit 15 may retrieve the image 1111 from the image capturing unit 11 for further processing.

More specifically, after retrieving the image 1111, the processing unit 15 may define a first boundary B21 and a second boundary B22 in the image 1111. Next, the processing unit 15 may identify the wafer chuck 92 of the wafer transportation system 9 in the image 1111, and determine whether the wafer chuck 92 intersects the first boundary B21 or the second boundary B22 in the image 1111.

According to the image 1111, the processing unit 15 may determine that the wafer chuck 92 does not intersect the first boundary B21 or the second boundary B22 in the image 1111. Accordingly, the image capturing unit 11 may continue capturing images of the wafer transportation system 9 during the transportation of the wafer chuck 92.

Figure 4B:
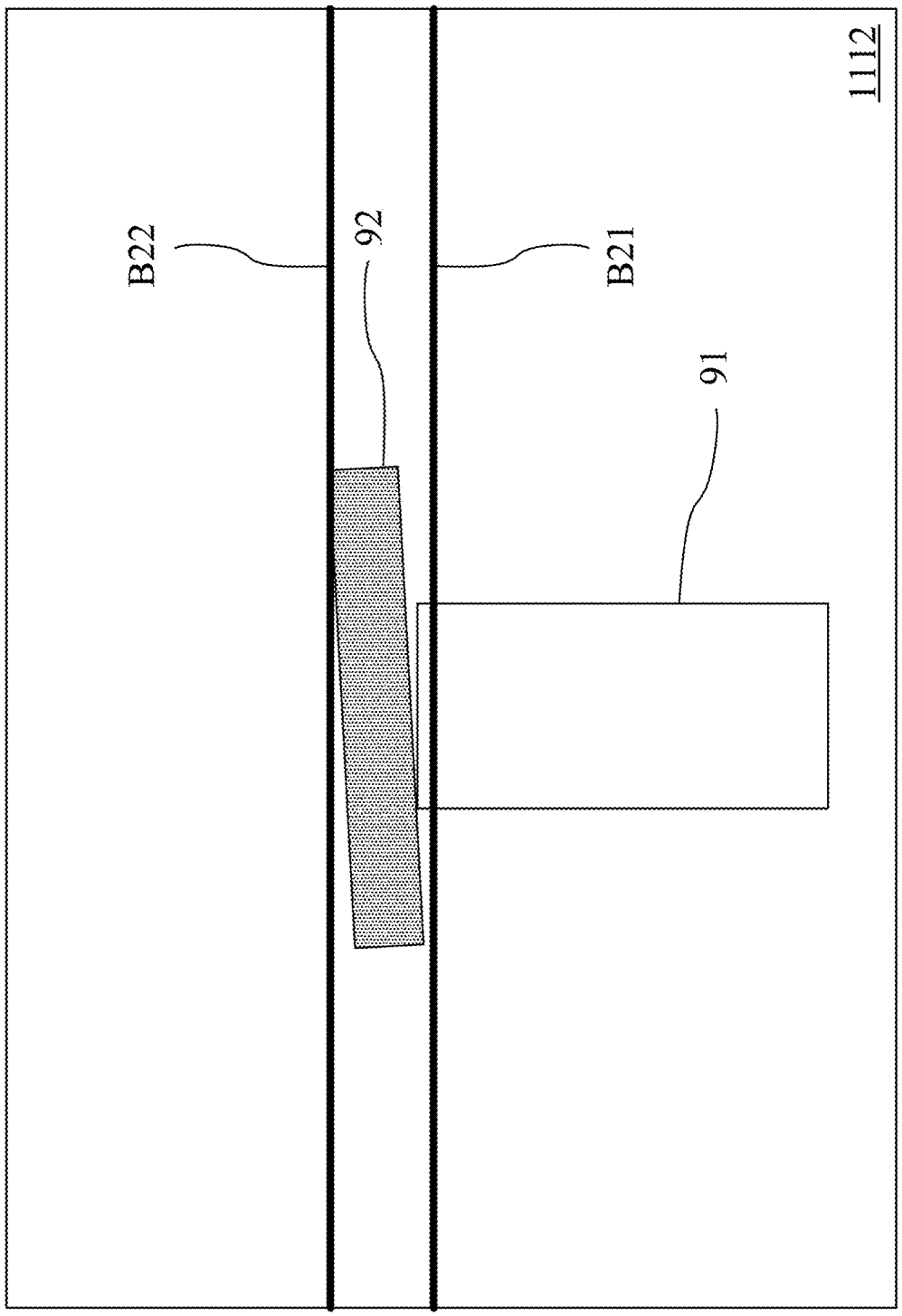

Please refer to FIG. 4B, which is a schematic view of an image of the wafer transportation system 9 according to some embodiments of the present disclosure. In detail, the image capturing unit 11 may capture an image 1112 of the wafer transportation system 9 at a time $T_{22}$. The processing unit 15 may retrieve the image 1112 from the image capturing unit 11 for further processing.

More specifically, after retrieving the image 1112, the processing unit 15 may define the first boundary B21 and the second boundary B22 in the image 1112. It should be noted that, in some embodiments, the images 1111 and 1112 may have the same size, and the first boundary B21 and the second boundary B22 may be defined at the same locations respectively in the images 1111 and 1112.

Next, the processing unit 15 may identify the wafer chuck 92 of the wafer transportation system 9 in the image 1112, and determine whether the wafer chuck 92 intersects the first boundary B21 or the second boundary B22 in the image 1112.

According to the image 1112, the wafer chuck 92 may be displaced from the surface of the robot 91 due to an impact, and the processing unit 15 may determine that the wafer chuck 92 intersects the second boundary B22 in the image 1112, and, as a result, the transportation of the wafer chuck 92 will be stopped. Accordingly, the processing unit 15 may transmit the alert signal 150 to the wafer transportation system 9 via the input/output unit 13.

Subsequently, in some embodiments, to prevent the wafer loaded in the wafer chuck 92 from being damaged during the automatic transportation, the wafer transportation system 9 may stop the transportation of the wafer chuck 92 according to the alert signal 150.

Figure 4C:
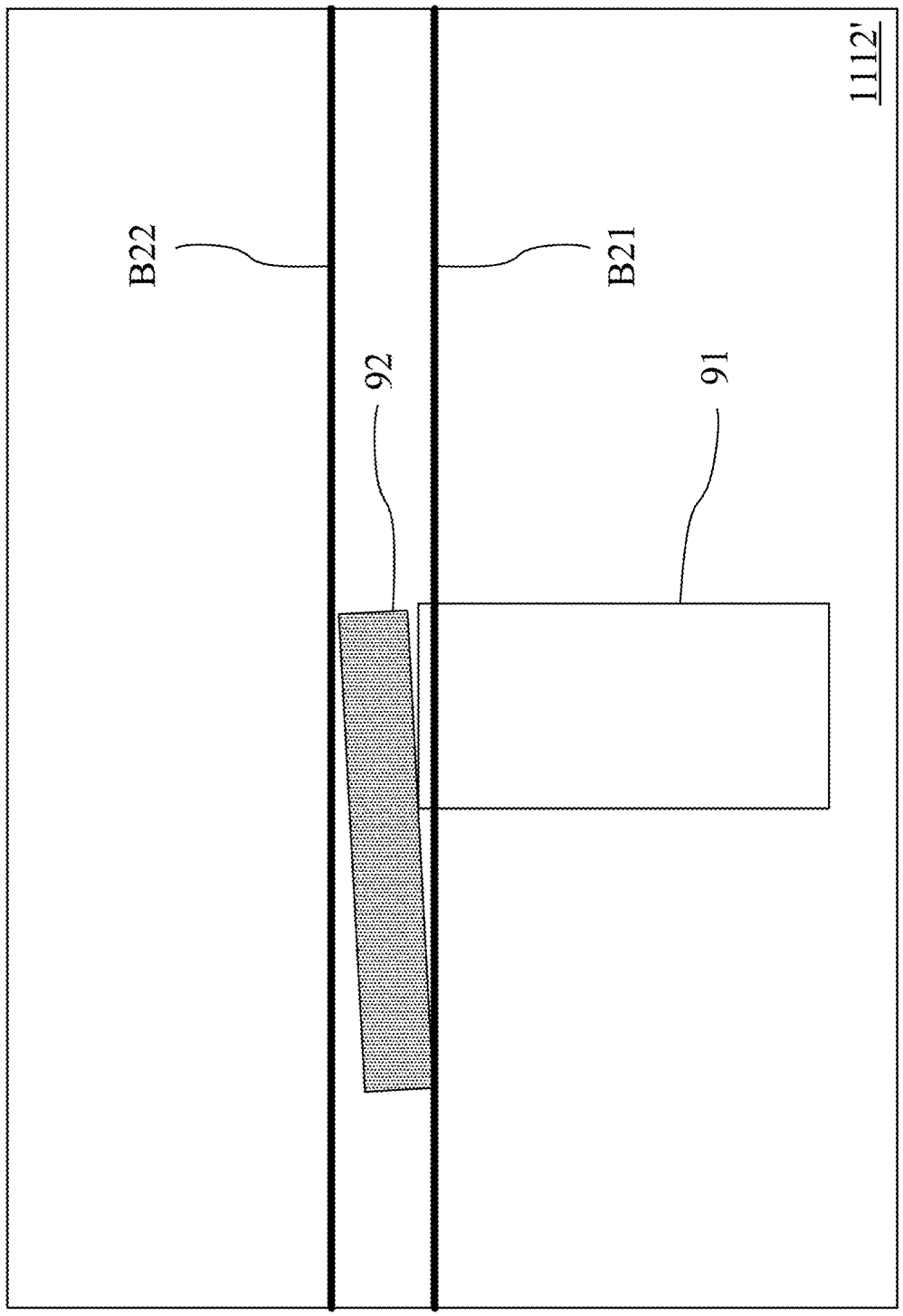

Please refer to FIG. 4C, which is a schematic view of an image of the wafer transportation system 9 according to some embodiments of the present disclosure. In detail, the image capturing unit 11 may capture an image 1112' of the wafer transportation system 9 at a time $T_{22}'$. The processing unit 15 may retrieve the image 1112' from the image capturing unit 11 for further processing.

More specifically, after retrieving the image 1112', the processing unit 15 may define the first boundary B21 and the second boundary B22 in the image 1112'. It should be noted that, in some embodiments, the images 1111 and 1112' may have the same size, and the first boundary B21 and the second boundary B22 may be defined at the same locations respectively in the images 1111 and 1112'.

Next, the processing unit 15 may identify the wafer chuck 92 of the wafer transportation system 9 in the image 1112', and determine whether the wafer chuck 92 intersects the first boundary B21 or the second boundary B22 in the image 1112'.

According to the image 1112', the wafer chuck 92 may be displaced on the robot 91, and the processing unit 15 may determine that the wafer chuck 92 intersects the first boundary B21 in the image 1112', and, as a result, the transportation of the wafer chuck 92 will be stopped. Accordingly, the processing unit 15 may transmit the alert signal 150 to the wafer transportation system 9 via the input/output unit 13.

Subsequently, in some embodiments, to prevent the wafer loaded in the wafer chuck 92 from being damaged during the automatic transportation, the wafer transportation system 9 may stop the transportation of the wafer chuck 92 according to the alert signal 150.

Figure 5A:
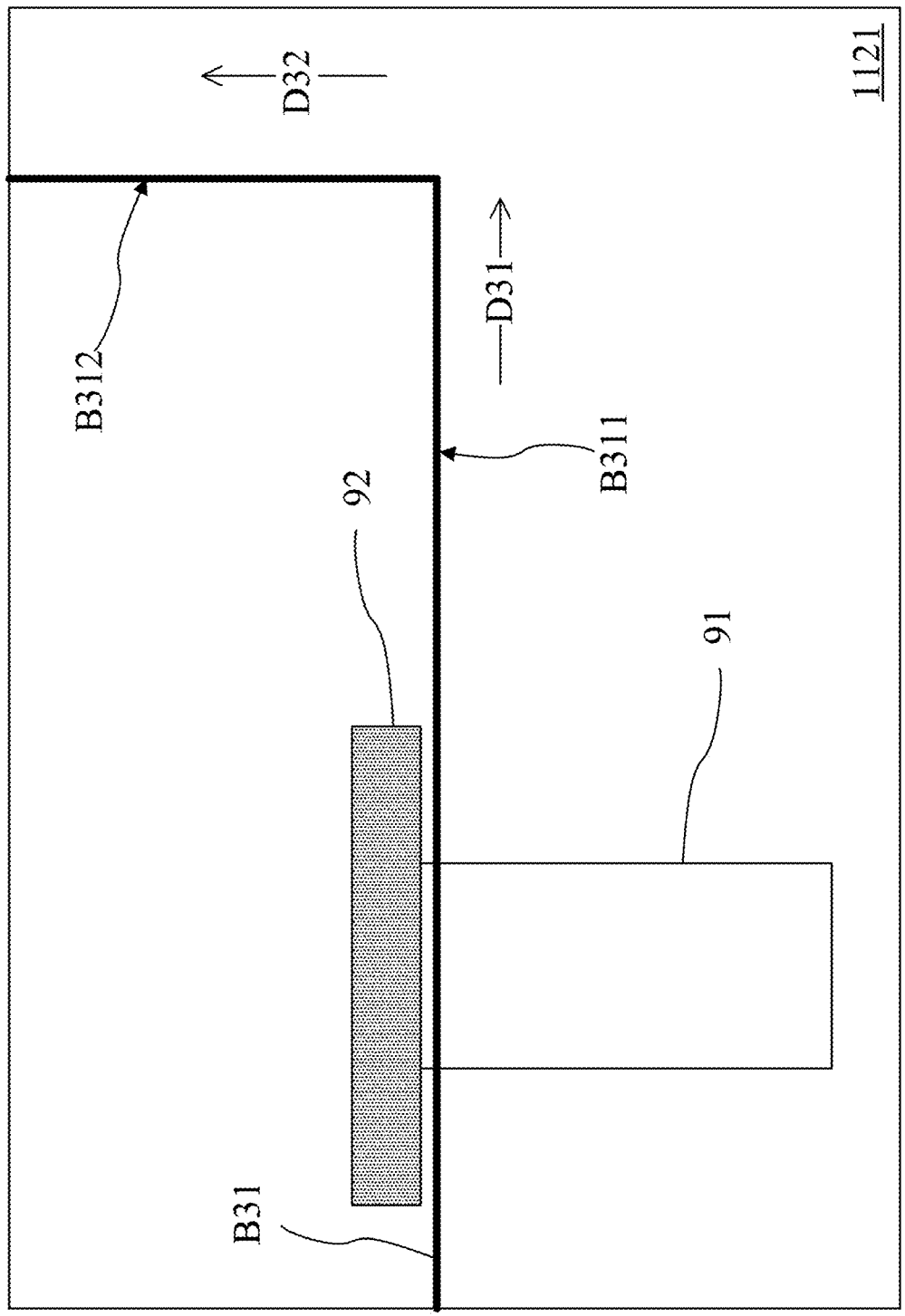
FIGS. 5A and 5B are schematic views of images of the wafer transportation system according to some embodiments of the present disclosure.

Please refer to FIG. 5A, which is a schematic view of an image of the wafer transportation system 9 according to some embodiments of the present disclosure. In detail, the image capturing unit 11 may capture an image 1121 of the wafer transportation system 9 at a time $T_{31}$. The processing unit 15 may retrieve the image 1121 from the image capturing unit 11 for further processing.

More specifically, after retrieving the image 1121, the processing unit 15 may define a first boundary B31 in the image 1121. Next, the processing unit 15 may identify the wafer chuck 92 of the wafer transportation system 9 in the image 1121, and determine whether the wafer chuck 92 intersects the first boundary B31 in the image 1121.

In some implementations, the first boundary B31 may be defined according to a transportation route of the wafer chuck 92. Particularly, the wafer chuck 92 may first be transported along a first direction D31, and may then be transported along a second direction D32, which is different from the first direction D31. Accordingly, the first boundary B31 may include a first line B311 in the first direction D31 and a second line B312 in the second direction D32.

According to the image 1121, the processing unit 15 may determine that the wafer chuck 92 does not intersect the first boundary B31. Accordingly, the image capturing unit 11 may continue capturing images of the wafer transportation system 9 during the transportation of the wafer chuck 92.

Figure 5B:
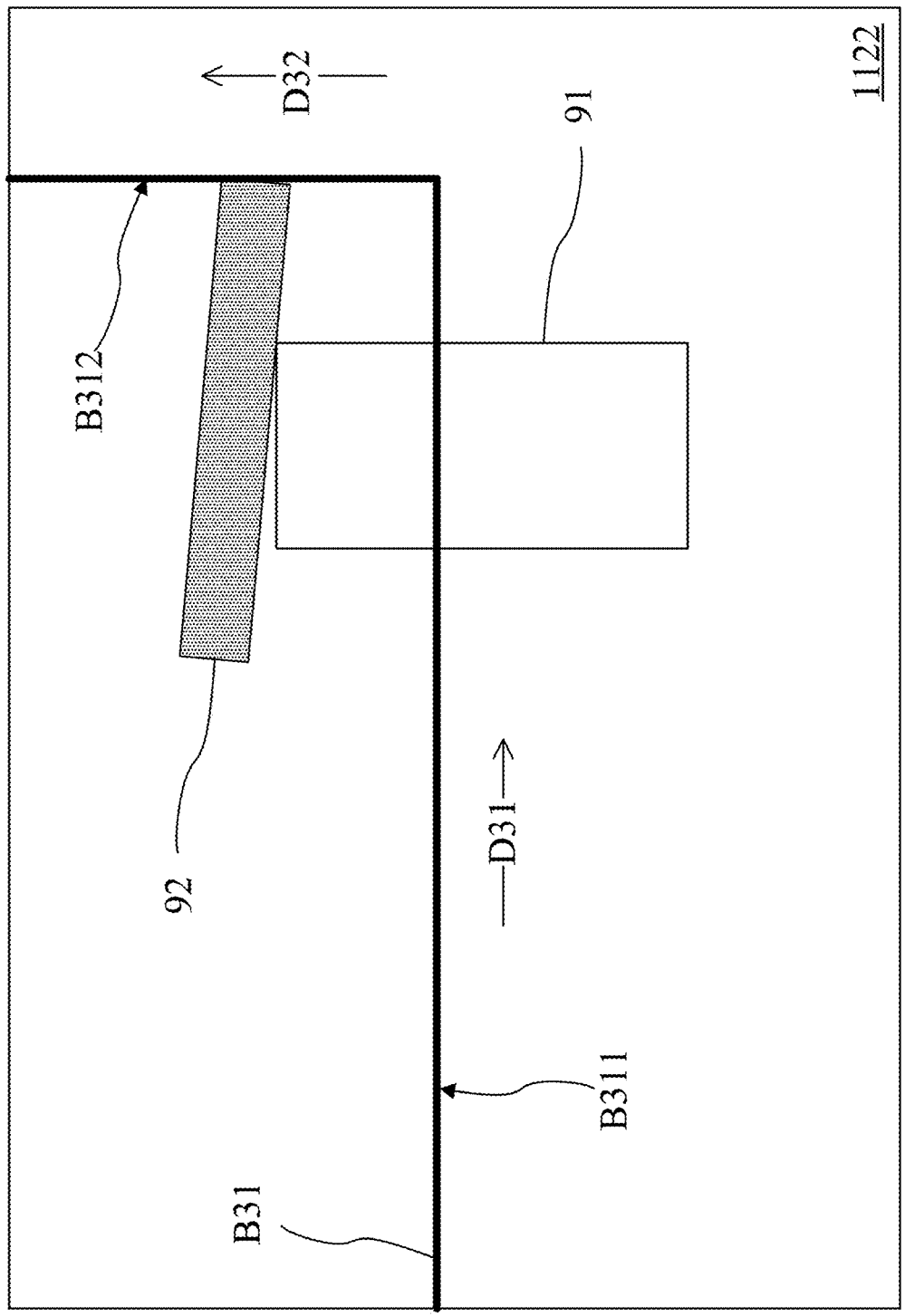

Please refer to FIG. 5B, which is a schematic view of an image of the wafer transportation system 9 according to some embodiments of the present disclosure. In detail, the image capturing unit 11 may capture an image 1122 of the wafer transportation system 9 at a time $T_{32}$. The processing unit 15 may retrieve the image 1122 from the image capturing unit 11 for further processing.

More specifically, after retrieving the image 1122, the processing unit 15 may define the first boundary B31 in the image 1122. It should be noted that, in some embodiments, the images 1121 and 1122 may have the same size, and the first boundary B31 may be defined at the same location in the images 1121 and 1122.

Next, the processing unit 15 may identify the wafer chuck 92 of the wafer transportation system 9 in the image 1122, and determine whether the wafer chuck 92 intersects the first boundary B31.

According to the image 1122, the wafer chuck 92 may be mispositioned on the robot 91, and the processing unit 15 may determine that the wafer chuck 92 intersects the second line B312 of the first boundary B31 in the image 1122, and, as a result, the transportation of the wafer chuck 92 will be stopped. Accordingly, the processing unit 15 may transmit the alert signal 150 to the wafer transportation system 9 via the input/output unit 13.

Subsequently, in some embodiments, to prevent the wafer loaded in the wafer chuck 92 from being damaged during the automatic transportation, the wafer transportation system 9 may stop the transportation of the wafer chuck 92 according to the alert signal 150.

In some embodiments, the input/output unit 13 may be configured to receive an input data from a user, and boundary B11, B21, B22, or B31 may be defined according to the input data. In particular, because the transportation route of the robot 91 for transporting the wafer chuck 92 may be different in different scenarios, boundaries used for determining whether the transportation of the wafer chuck 92 will be stopped may be adjusted by the user for different scenarios.

In some implementations, the input data may include a location, a length, and coordinates data of the boundary. In some implementations, the input data may be lines drawn directly by the user.

Figure 6:
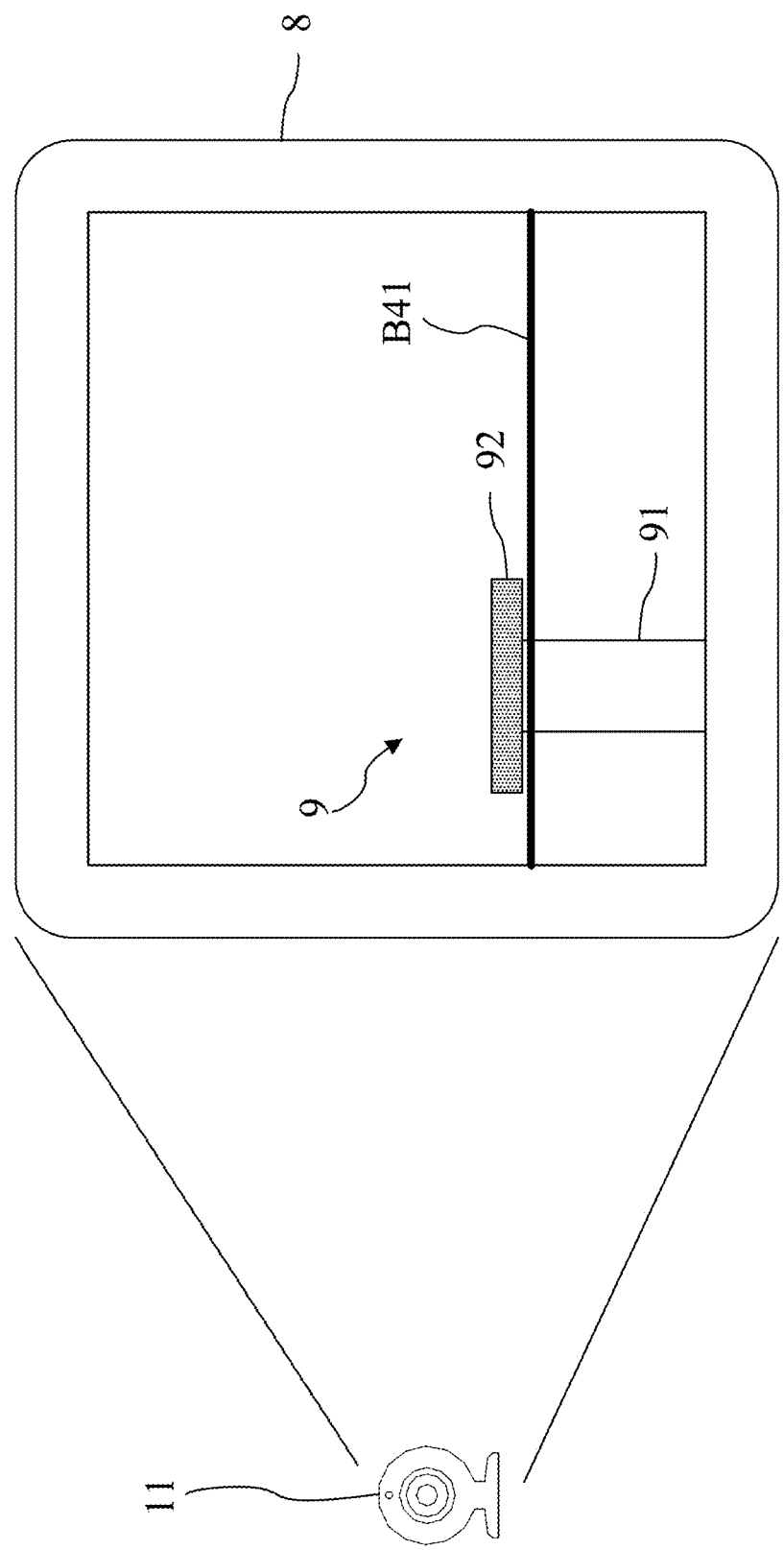
FIG. 6 is a schematic view of an image capturing unit capturing images of a monitor displaying a wafer transportation system according to some embodiments of the present disclosure.

Please refer to FIG. 6, which is a schematic view of the image capturing unit 11 capturing images of a monitor 8 displaying the wafer transportation system 9 according to some embodiments of the present disclosure. Particularly, in some embodiments, another image capturing unit (not shown) may be used for capturing the images of the wafer transportation system 9 when the wafer transportation system 9 is transporting the wafer chuck 92, and the captured images may be displayed on the monitor 8. In such embodiments, a first boundary B41 may be displayed on the monitor 8.

Figure 7A:
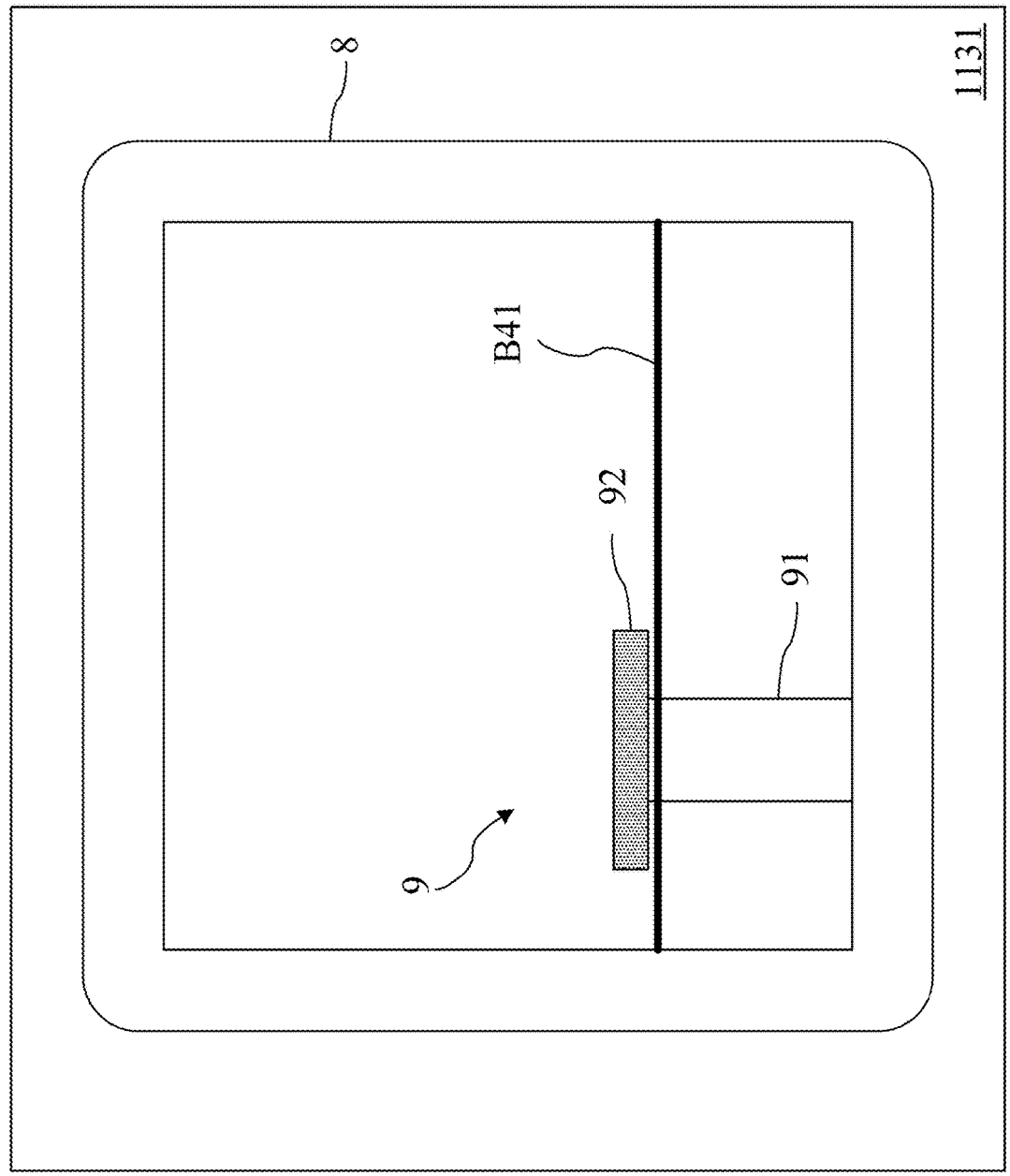
FIGS. 7A to 7C are schematic views of images of a monitor displaying a wafer transportation system according to some embodiments of the present disclosure.

Please refer to FIG. 7A, which is a schematic view of an image of the monitor 8 displaying the wafer transportation system 9 according to some embodiments of the present disclosure. In detail, the image capturing unit 11 may capture an image 1131 of the monitor 8 at a time $T_{41}$. The processing unit 15 may retrieve the image 1131 from the image capturing unit 11 for further processing.

More specifically, after retrieving the image 1131, the processing unit 15 may identify the wafer chuck 92 of the wafer transportation system 9 and the first boundary B41 in the image 1131, and determine whether the wafer chuck 92 intersects the first boundary B41 in the image 1131.

According to the image 1131, the processing unit 15 may determine that the wafer chuck 92 does not intersect the first boundary B41 in the image 1131. Accordingly, the image capturing unit 11 may continue capturing images of the wafer transportation system 9 during the transportation of the wafer chuck 92.

Figure 7B:
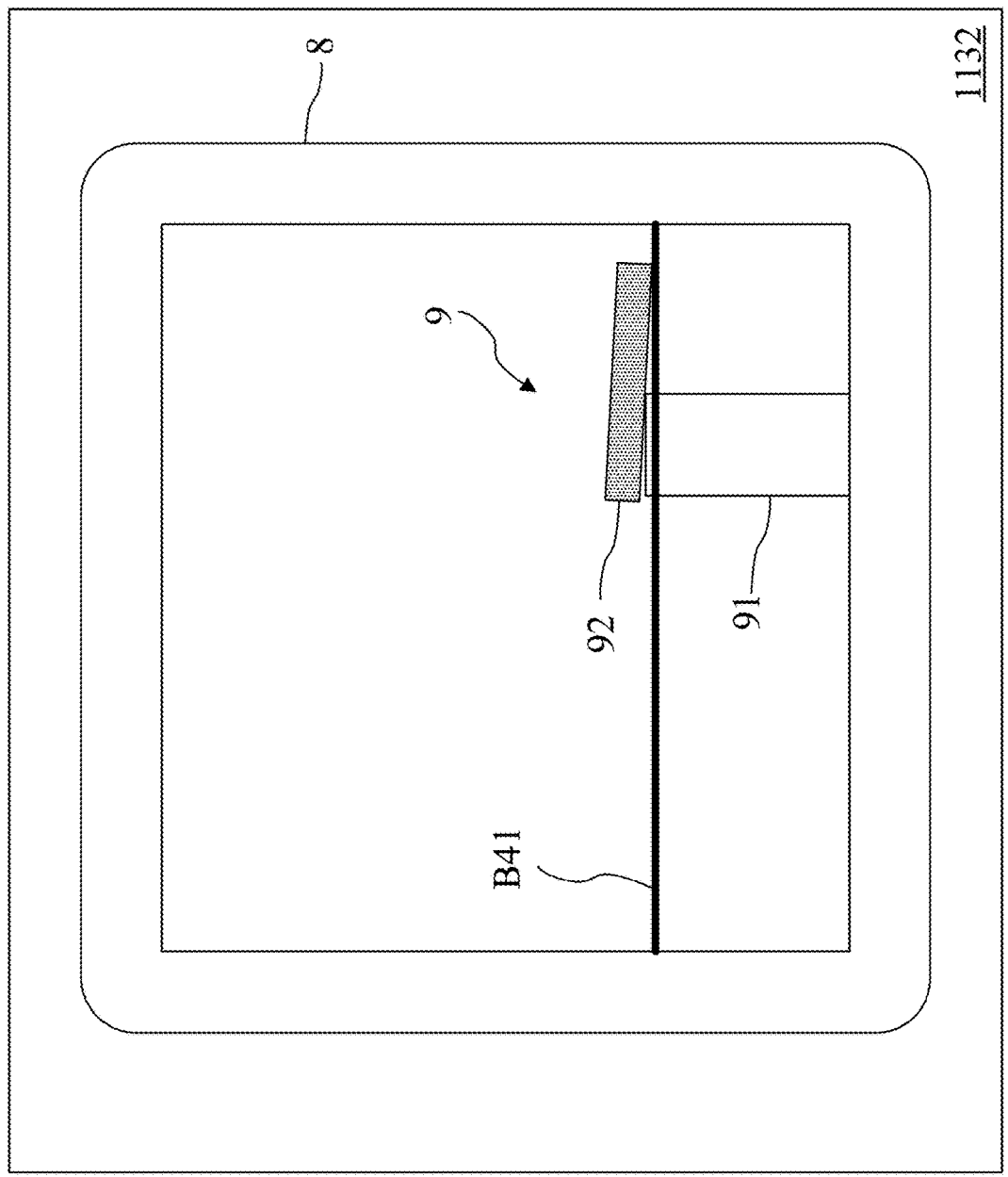

Please refer to FIG. 7B, which is a schematic view of an image of the monitor 8 displaying the wafer transportation system 9 according to some embodiments of the present disclosure. In detail, the image capturing unit 11 may capture an image 1132 of the monitor 8 at a time $T_{42}$. The processing unit 15 may retrieve the image 1132 from the image capturing unit 11 for further processing.

More specifically, after retrieving the image 1132, the processing unit 15 may identify the wafer chuck 92 of the wafer transportation system 9 and the first boundary B41 in the image 1132, and determine whether the wafer chuck 92 intersects the first boundary B41 in the image 1132.

According to the image 1132, the wafer chuck 92 may be mispositioned on the robot 91, and the processing unit 15 may determine that the wafer chuck 92 intersects the first boundary B41 in the image 1132, and, as a result, the transportation of the wafer chuck 92 will be stopped. Accordingly, the processing unit 15 may transmit the alert signal 150 to the wafer transportation system 9 via the input/output unit 13.

Subsequently, in some embodiments, to prevent the wafer loaded in the wafer chuck 92 from being damaged during the automatic transportation, the wafer transportation system 9 may stop the transportation of the wafer chuck 92 according to the alert signal 150.

Figure 7C:
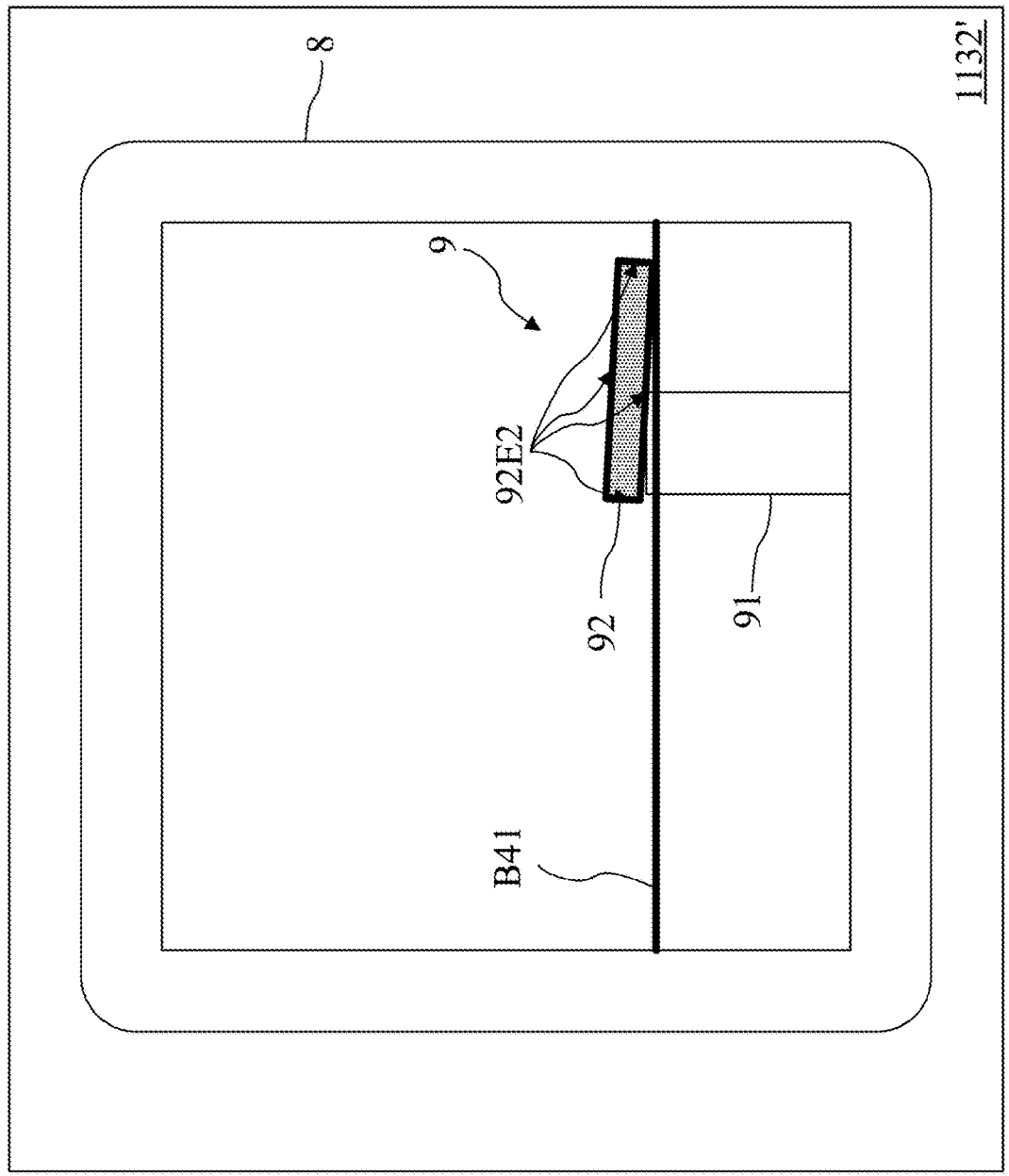

In some embodiments, edges of the wafer chuck 92 may be used for determining whether the wafer chuck 92 intersects the first boundary B41 in captured images. Please refer to FIG. 7C, which is a schematic view of an image of the monitor 8 displaying the wafer transportation system 9 according to some embodiments of the present disclosure. In detail, the image capturing unit 11 may capture an image 1132' of the monitor 8 at a time $T_{42}'$. The processing unit 15 may retrieve the image 1132' from the image capturing unit 11 for further processing.

More specifically, after retrieving the image 1132', the processing unit 15 may identify the wafer chuck 92 of the wafer transportation system 9 and the first boundary B41 in the image 1132'. Further, the processing unit 15 may determine edges 92E2 of the wafer chuck 92, and then determine whether the edges 92E2 of the wafer chuck 92 intersect the first boundary B41 in the image 1132'.

According to the image 1132', the wafer chuck 92 may be misplaced on the robot 91, and the processing unit 15 may determine that the edge 92E2 of the wafer chuck 92 intersects the first boundary B41 in the image 1132', and, as a result, the transportation of the wafer chuck 92 will be stopped. Accordingly, the processing unit 15 may transmit the alert signal 150 to the wafer transportation system 9 via the input/output unit 13.

Subsequently, in some embodiments, to prevent the wafer loaded in the wafer chuck 92 from being damaged during the automatic transportation, the wafer transportation system 9 may stop the transportation of the wafer chuck 92 according to the alert signal 150.

Figure 8:
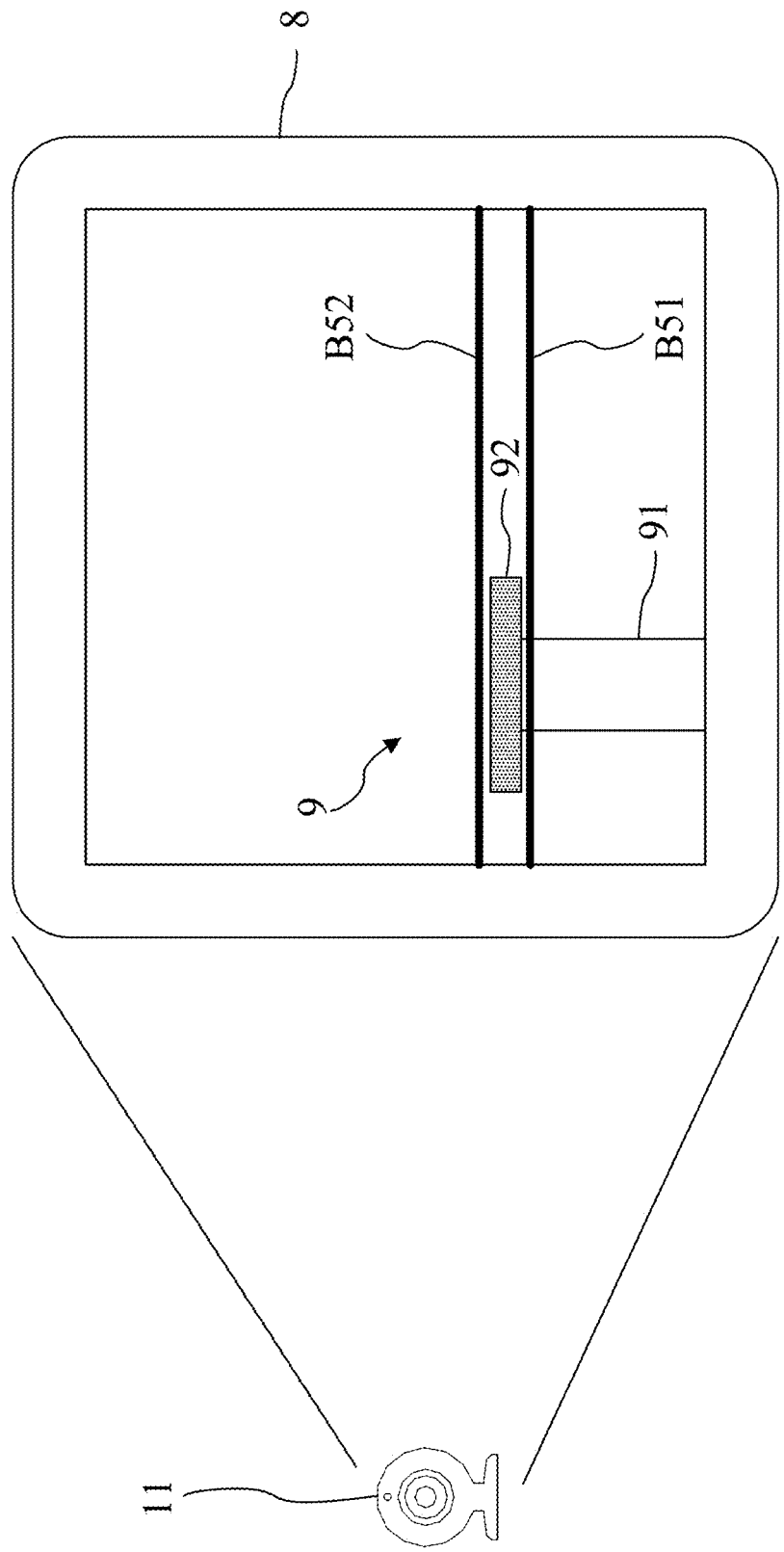
FIG. 8 is a schematic view of an image capturing unit capturing images of a monitor displaying a wafer transportation system according to some embodiments of the present disclosure.

Please refer to FIG. 8, which is a schematic view of the image capturing unit 11 capturing images of the monitor 8 displaying the wafer transportation system 9 according to some embodiments of the present disclosure. In such embodiments, a first boundary B51 and a second boundary B52 may be displayed on the monitor 8.

Figure 9A:
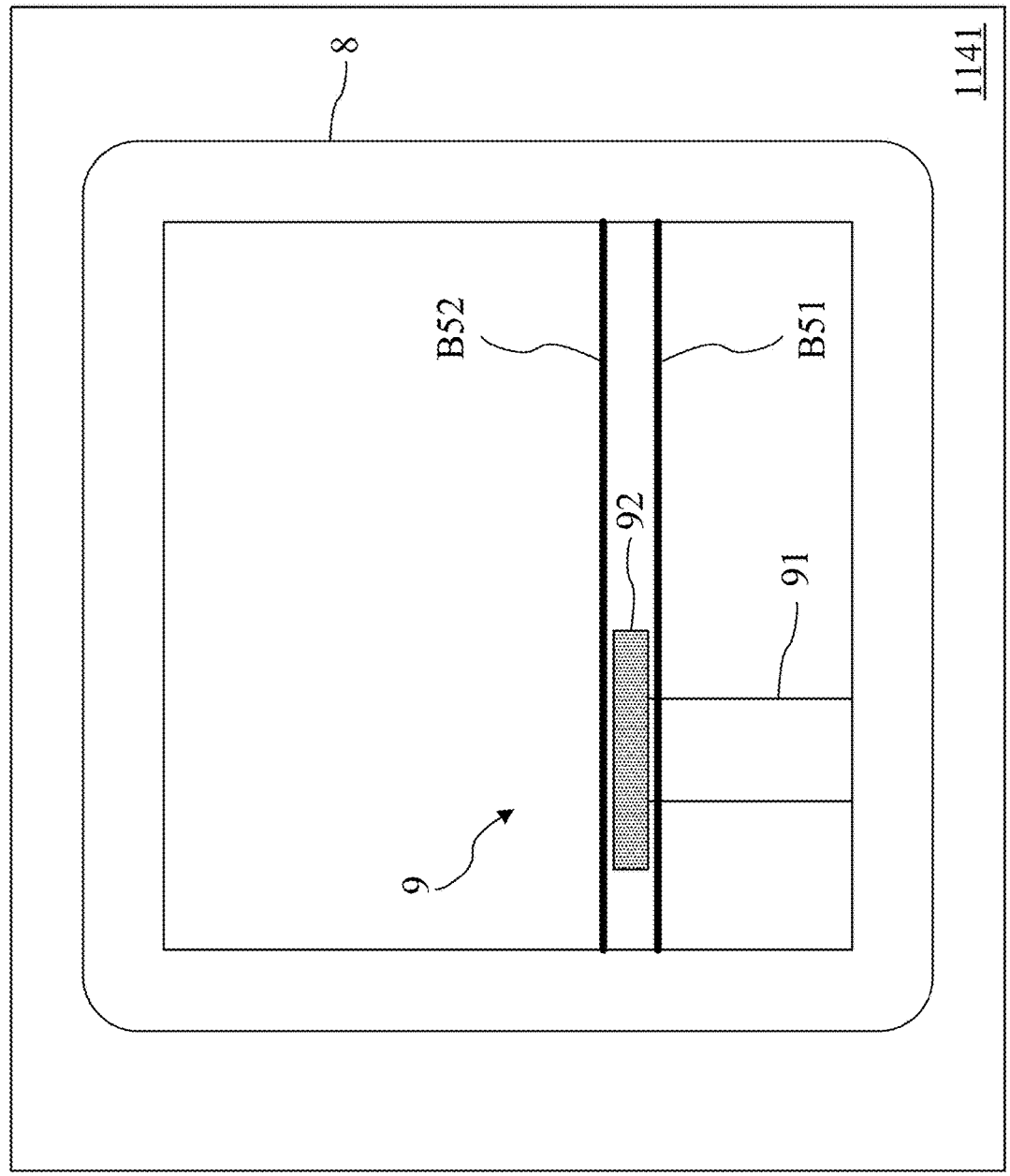
FIGS. 9A to 9C are schematic views of images of a monitor displaying a wafer transportation system according to some embodiments of the present disclosure.

Please refer to FIG. 9A, which is a schematic view of an image of the monitor 8 displaying the wafer transportation system 9 according to some embodiments of the present disclosure. In detail, the image capturing unit 11 may capture an image 1141 of the monitor 8 at a time $T_{51}$. The processing unit 15 may retrieve the image 1141 from the image capturing unit 11 for further processing.

More specifically, after retrieving the image 1141, the processing unit 15 may identify the wafer chuck 92 of the wafer transportation system 9, the first boundary B51 and the second boundary B52 in the image 1141, and determine whether the wafer chuck 92 intersects the first boundary B51 or the second boundary B52 in the image 1141.

According to the image 1141, the processing unit 15 may determine that the wafer chuck 92 does not intersect the first boundary B51 or the second boundary B52 in the image 1141. Accordingly, the image capturing unit 11 may continue capturing images of the wafer transportation system 9 during the transportation of the wafer chuck 92.

Figure 9B:
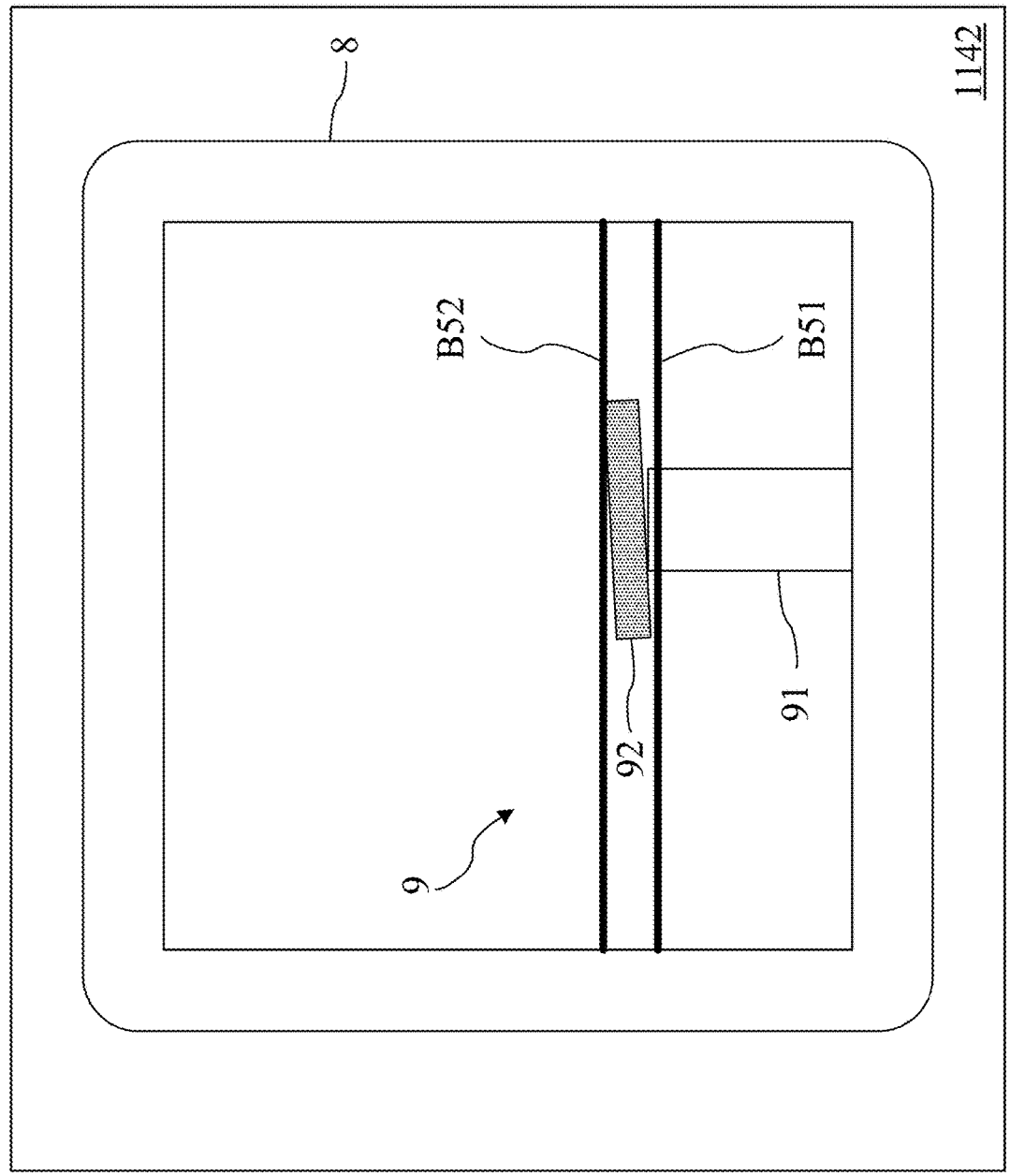

Please refer to FIG. 9B, which is a schematic view of an image of the monitor 8 displaying the wafer transportation system 9 according to some embodiments of the present disclosure. In detail, the image capturing unit 11 may capture an image 1142 of the monitor 8 at a time $T_{52}$. The processing unit 15 may retrieve the image 1142 from the image capturing unit 11 for further processing.

More specifically, after retrieving the image 1142, the processing unit 15 may identify the wafer chuck 92 of the wafer transportation system 9, the first boundary B51 and the second boundary B52 in the image 1142, and determine whether the wafer chuck 92 intersects the first boundary B51 or the second boundary B52 in the image 1142.

According to the image 1142, the wafer chuck 92 may be displaced from the surface of the robot 91 due to an impact, and the processing unit 15 may determine that the wafer chuck 92 intersects the second boundary B52 in the image 1142, and, as a result, the transportation of the wafer chuck 92 will be stopped. Accordingly, the processing unit 15 may transmit the alert signal 150 to the wafer transportation system 9 via the input/output unit 13.

Subsequently, in some embodiments, to prevent the wafer loaded in the wafer chuck 92 from being damaged during the automatic transportation, the wafer transportation system 9 may stop the transportation of the wafer chuck 92 according to the alert signal 150.

Figure 9C:
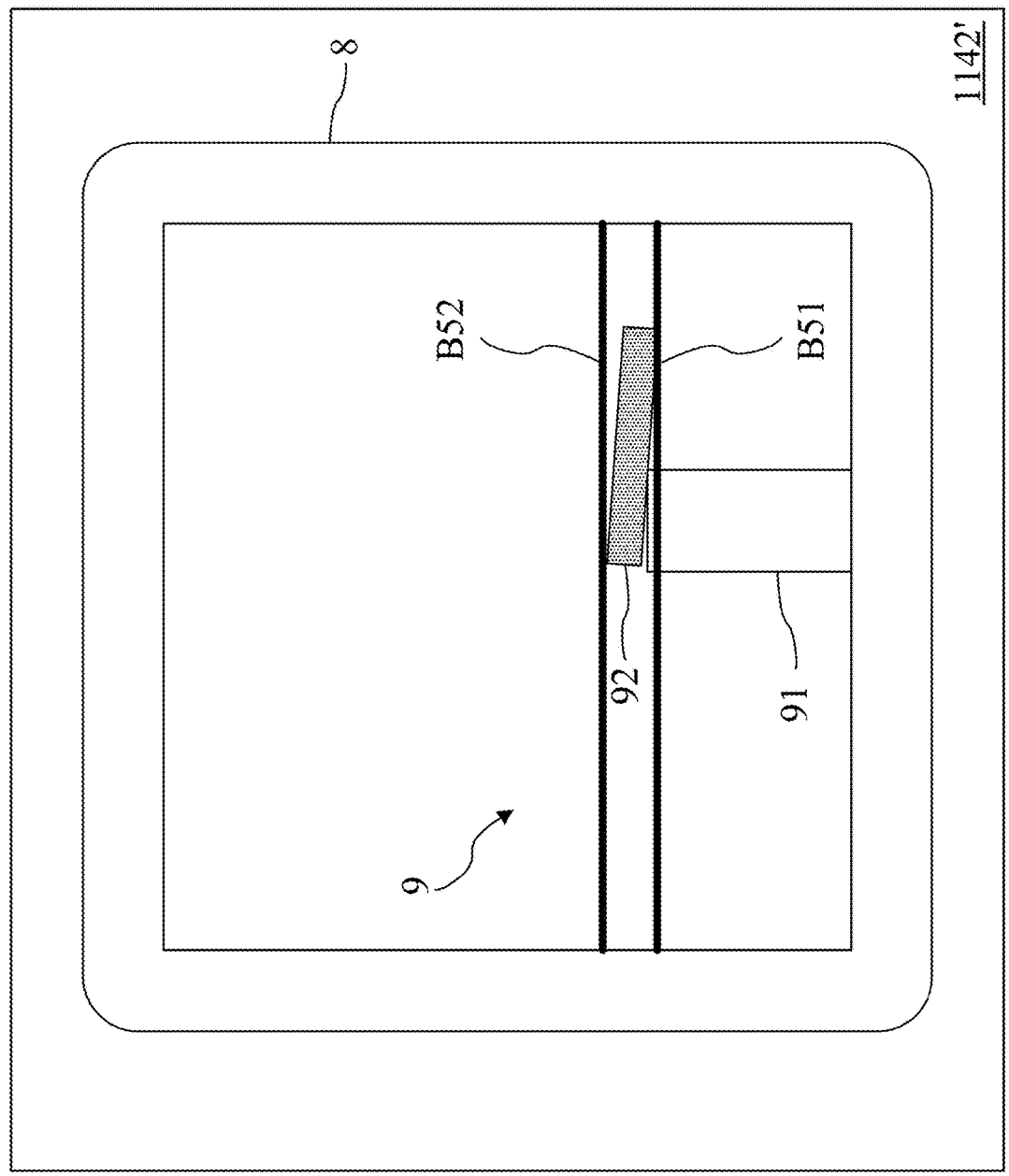

Please refer to FIG. 9C, which is a schematic view of an image of the monitor 8 displaying the wafer transportation system 9 according to some embodiments of the present disclosure. In detail, the image capturing unit 11 may capture an image 1142' of the monitor 8 at a time $T_{42}'$. The processing unit 15 may retrieve the image 1142' from the image capturing unit 11 for further processing.

More specifically, after retrieving the image 1142', the processing unit 15 may identify the wafer chuck 92 of the wafer transportation system 9, the first boundary B51 and the second boundary B52 in the image 1142,' and determine whether the wafer chuck 92 intersects the first boundary B51 or the second boundary B52 in the image 114T.

According to the image 1142', the wafer chuck 92 may be displaced on the robot 91, and the processing unit 15 may determine that the wafer chuck 92 intersects the first boundary B51 in the image 1142', and, as a result, the transportation of the wafer chuck 92 will be stopped. Accordingly, the processing unit 15 may transmit the alert signal 150 to the wafer transportation system 9 via the input/output unit 13.

Subsequently, in some embodiments, to prevent the wafer loaded in the wafer chuck 92 from being damaged during the automatic transportation, the wafer transportation system 9 may stop the transportation of the wafer chuck 92 according to the alert signal 150.

Figure 10:
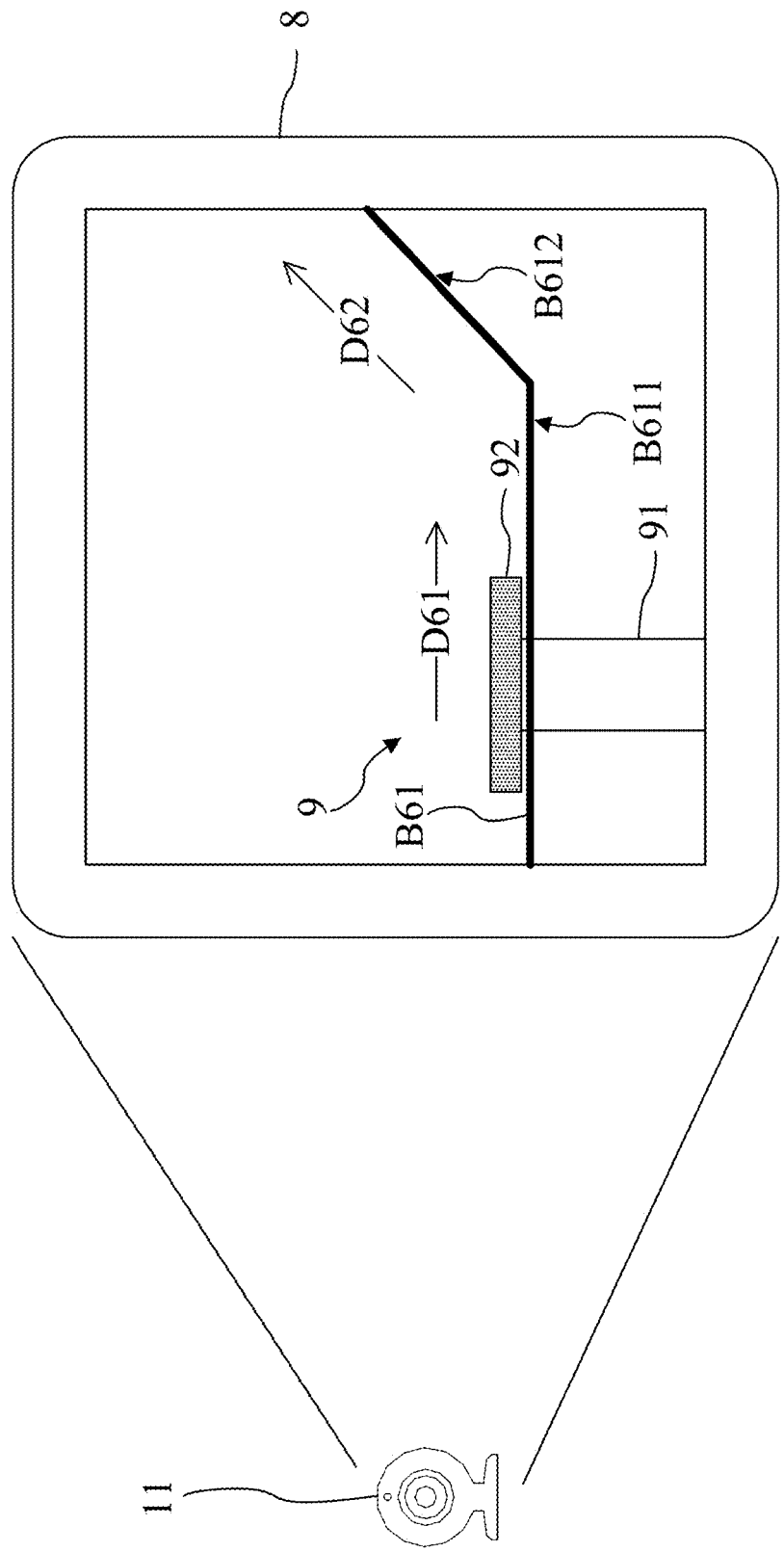
FIG. 10 is a schematic view of an image capturing unit capturing images of a monitor displaying a wafer transportation system according to some embodiments of the present disclosure.

Please refer to FIG. 10, which is a schematic view of the image capturing unit 11 capturing images of the monitor 8 displaying the wafer transportation system 9 according to some embodiments of the present disclosure. In such embodiments, a first boundary B61 may be displayed on the monitor 8.

In some implementations, the first boundary B61 may be displayed according to a transportation route of the wafer chuck 92. Particularly, the wafer chuck 92 may first be transported along a first direction D61, and may then be transported along a second direction D62, which is different from the first direction D61. Accordingly, the first boundary B61 may include a first line B611 in the first direction D61 and a second line B612 in the second direction D62.

Figure 11A:
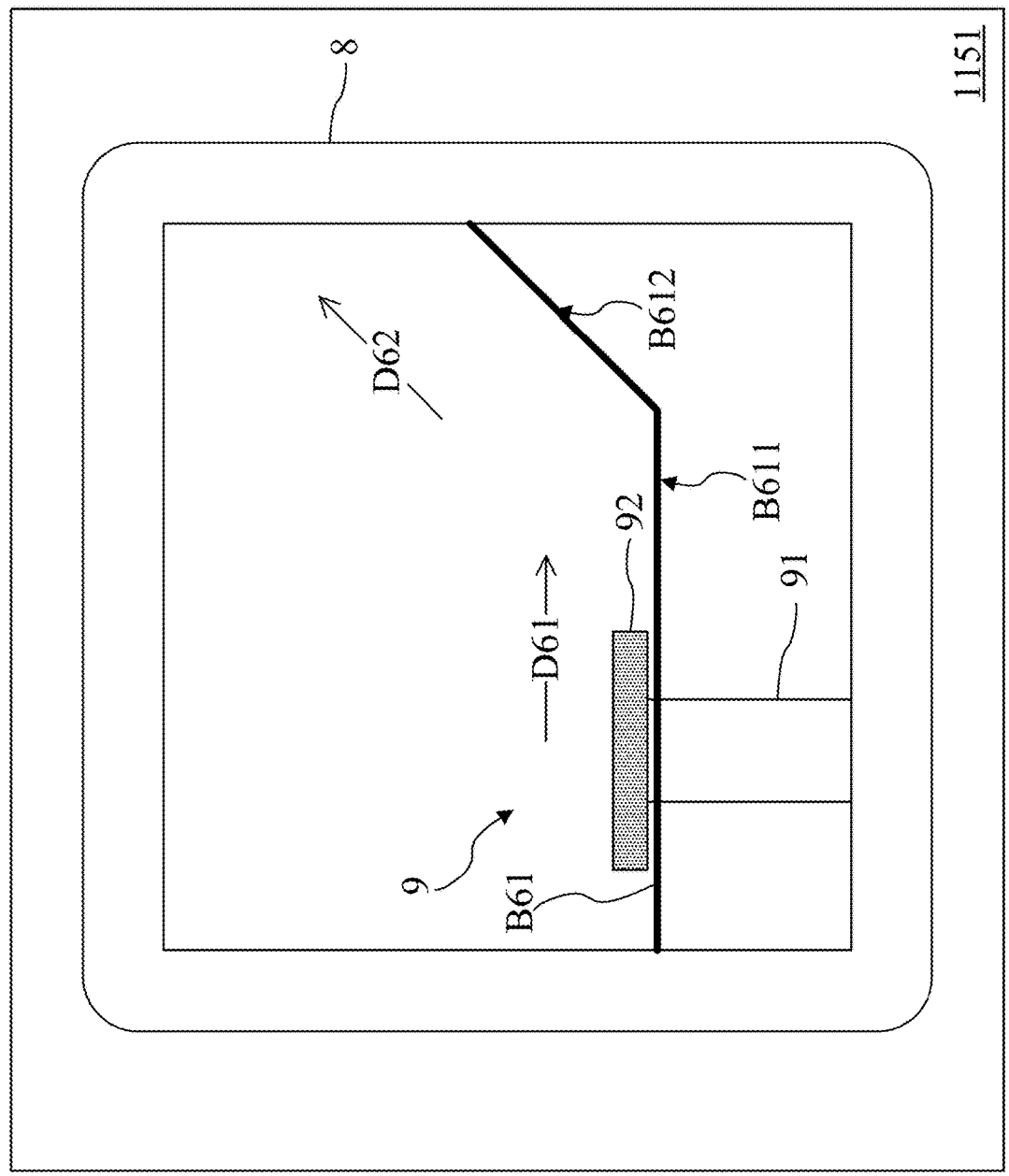
FIGS. 11A and 11B are schematic views of images of a monitor displaying a wafer transportation system according to some embodiments of the present disclosure.

Please refer to FIG. 11A, which is a schematic view of an image of the monitor 8 displaying the wafer transportation system 9 according to some embodiments of the present disclosure. In detail, the image capturing unit 11 may capture an image 1151 of the monitor 8 at a time $T_{61}$. The processing unit 15 may retrieve the image 1151 from the image capturing unit 11 for further processing.

More specifically, after retrieving the image 1151, the processing unit 15 may identify the wafer chuck 92 of the wafer transportation system 9 and the first boundary B61 in the image 1151, and determine whether the wafer chuck 92 intersects the first boundary B61 in the image 1151.

According to the image 1151, the processing unit 15 may determine that the wafer chuck 92 does not intersect the first boundary B61. Accordingly, the image capturing unit 11 may continue capturing images of the wafer transportation system 9 during the transportation of the wafer chuck 92.

Figure 11B:
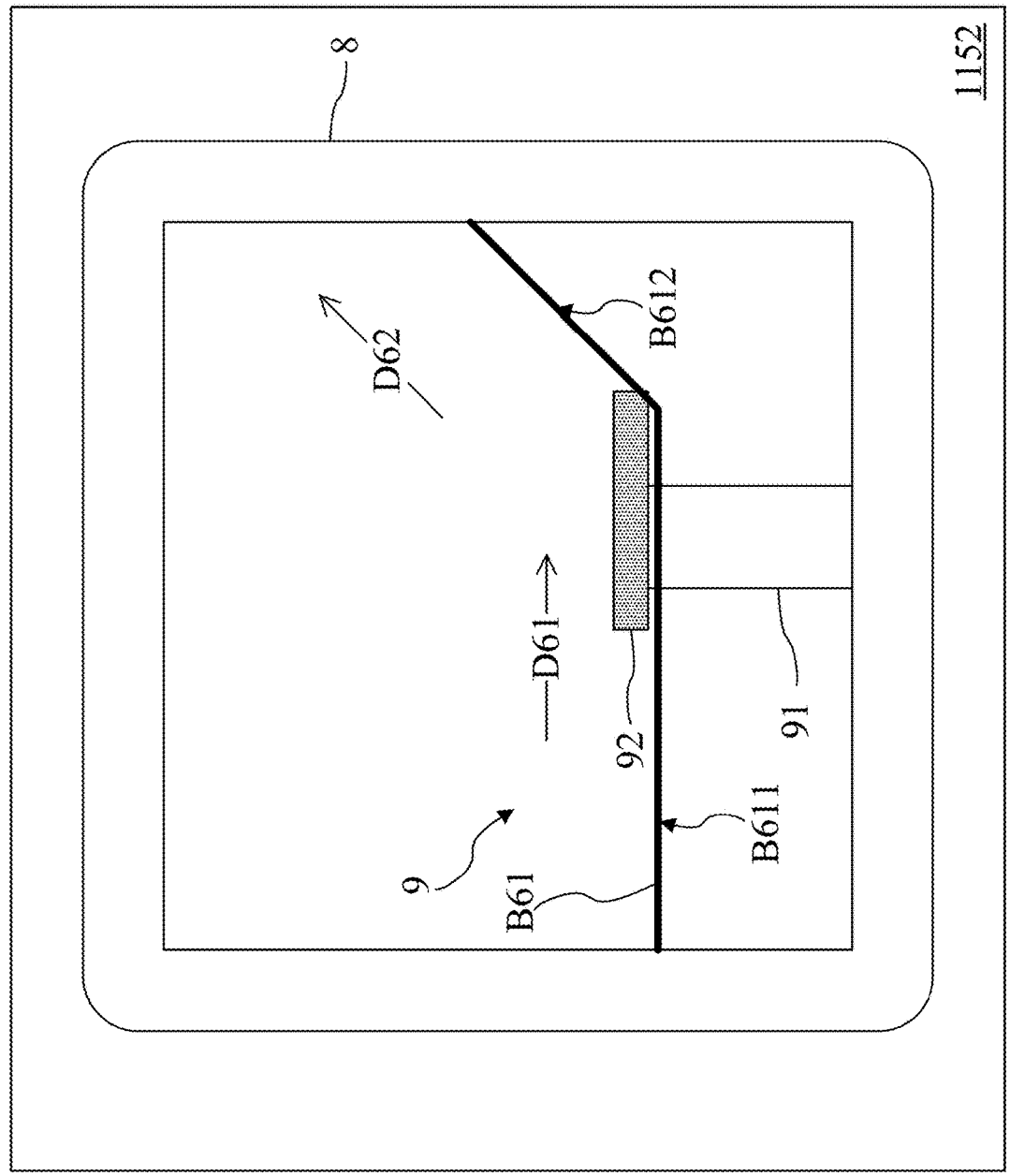

Please refer to FIG. 11B, which is a schematic view of an image of the monitor 8 displaying the wafer transportation system 9 according to some embodiments of the present disclosure. In detail, the image capturing unit 11 may capture an image 1152 of the monitor 8 at a time $T_{62}$. The processing unit 15 may retrieve the image 1152 from the image capturing unit 11 for further processing.

More specifically, after retrieving the image 1152, the processing unit 15 may identify the wafer chuck 92 of the wafer transportation system 9 and the first boundary B61 in the image 1152, and determine whether the wafer chuck 92 intersects the first boundary B61.

According to the image 1152, the wafer chuck 92 may be displaced on the robot 91, and the processing unit 15 may determine that the wafer chuck 92 intersects the second line B612 of the first boundary B61 in the image 1152, and, as a result, the transportation of the wafer chuck 92 will be stopped. Accordingly, the processing unit 15 may transmit the alert signal 150 to the wafer transportation system 9 via the input/output unit 13.

Subsequently, in some embodiments, to prevent the wafer loaded in the wafer chuck 92 from being damaged during the automatic transportation, the wafer transportation system 9 may stop the transportation of the wafer chuck 92 according to the alert signal 150.

In some embodiments, the boundary B41, B51, B52, or B61 displayed on the monitor 8 may be adjusted by the user. Particularly, because the transportation route of the robot 91 for transporting the wafer chuck 92 may be different in different scenarios, boundaries used for determining whether the transportation of the wafer chuck 92 will be stopped may be adjusted by the user for different scenarios.

In some embodiments, identifying the wafer chuck 92 may be achieved using some features of the wafer chuck 92. For example, the wafer chuck 92 may be identified according to a mark, a color or a shape of the wafer chuck 92. In some embodiments, identifying the boundary may be achieved using some features of the boundary. For example, the boundary may be identified according to a color or a shape of the boundary.

Figure 12:
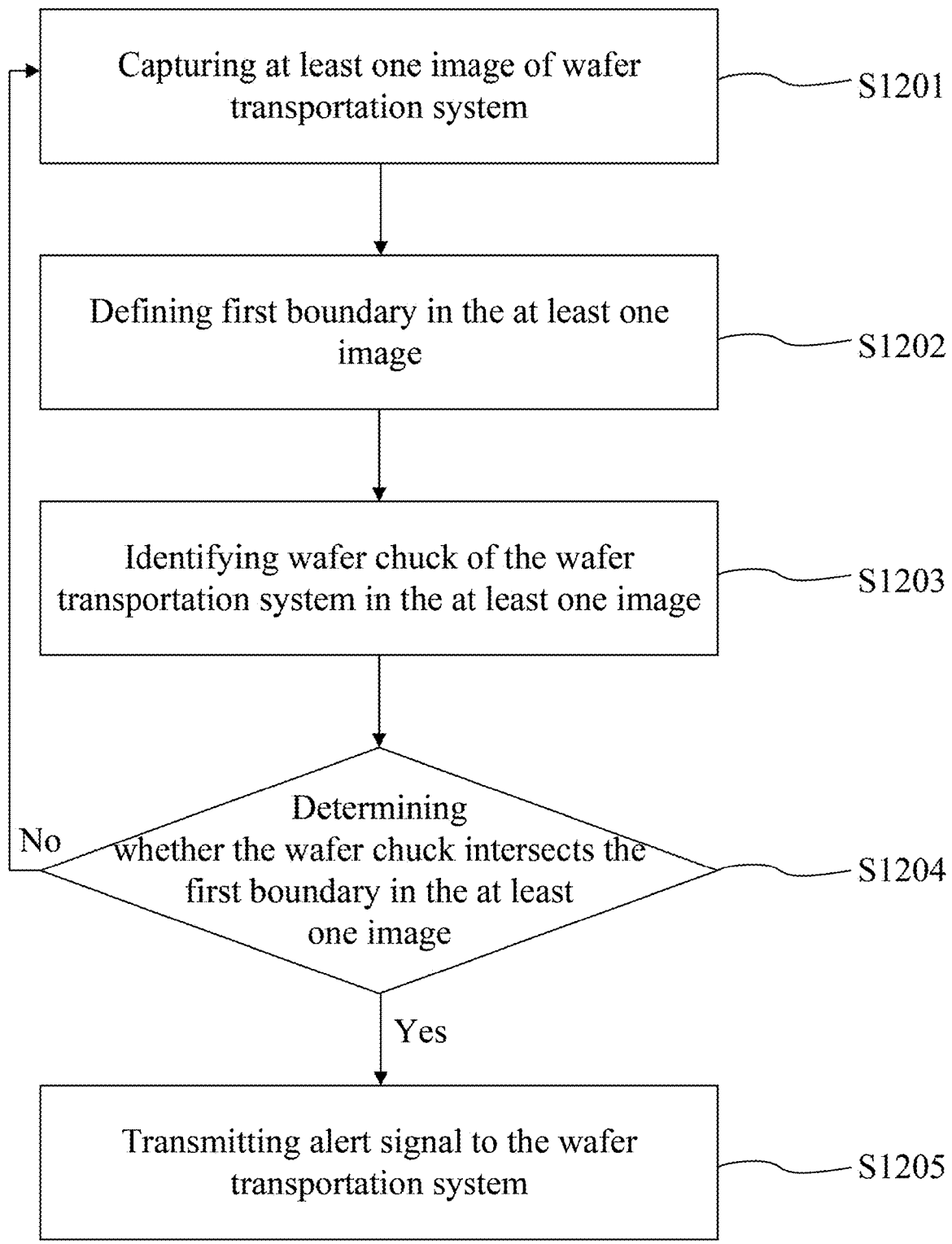
FIG. 12 is a flow diagram of an alert method according to some embodiments of the present disclosure.

Some embodiments of the present disclosure include an alert method, and a flowchart diagram thereof is shown in FIG. 12. The alert method of some embodiments is for use in an alert device (e.g., the alert device of the aforesaid embodiments). The alert device may include an image capturing unit, a processing unit and an input/output unit. Detailed steps of the alert method are described below.

Operation S1201 is executed to capture, by the image capturing unit, at least one image of a wafer transportation system. Operation S1202 is executed to define, by the processing unit, a first boundary in the at least one image. Operation S1203 is executed to identify, by the processing unit, a wafer chuck of the wafer transportation system in the at least one image. Operation S1204 is executed to determine, by the processing unit, whether the wafer chuck intersects the first boundary in the at least one image.

If the wafer chuck is determined to intersect the first boundary in the at least one image, operation S1205 is executed to transmit, by the processing unit, an alert signal to the wafer transportation system via the input/output unit, so as to make the wafer transportation system stop transporting the wafer chuck. If the wafer chuck is determined to not intersect the first boundary in the at least one image, operation S1201 is repeated.

Figure 13A:
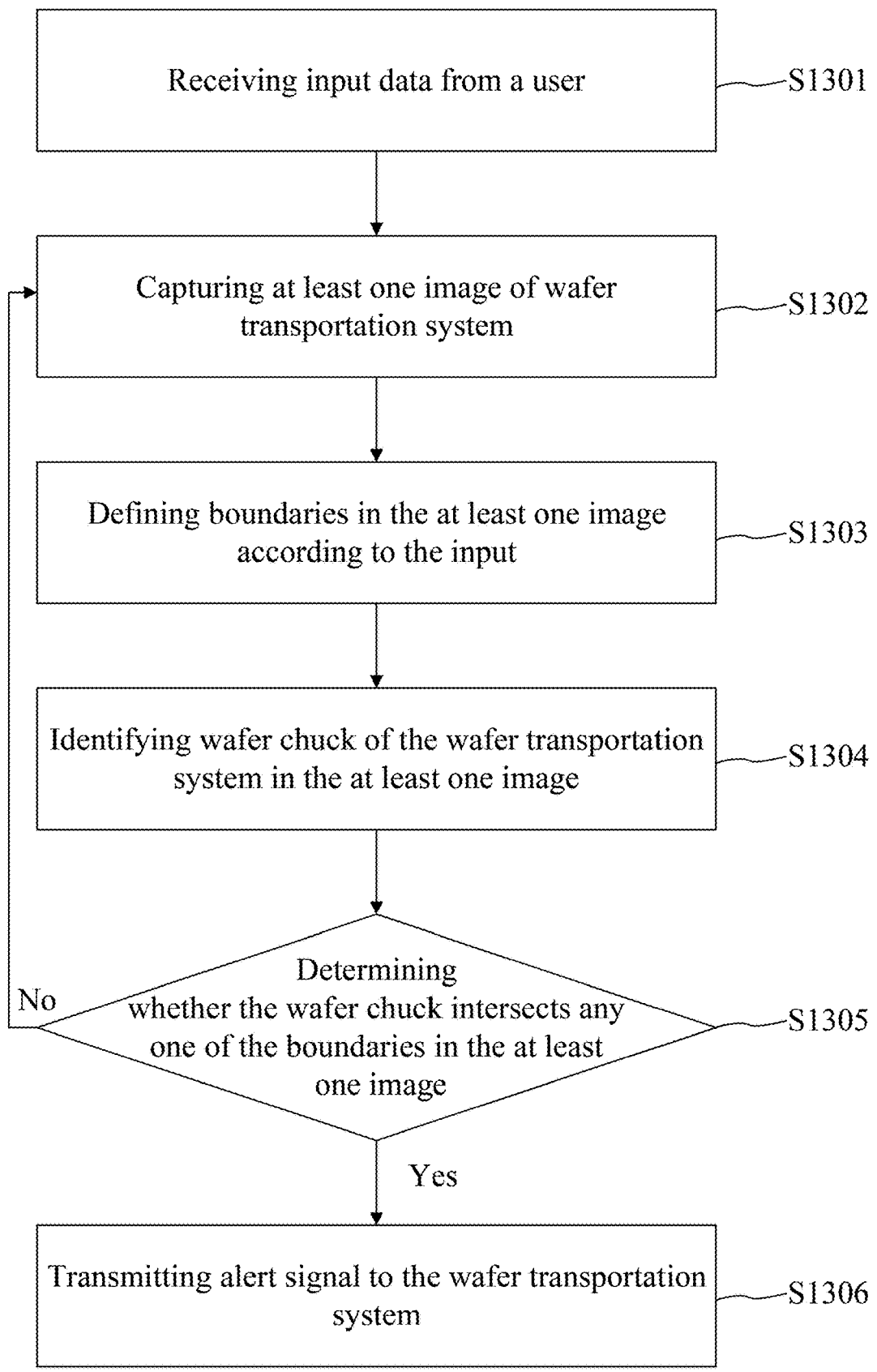
FIGS. 13A and 13B are flow diagrams of an alert method according to some embodiments of the present disclosure.
Figure 13B:
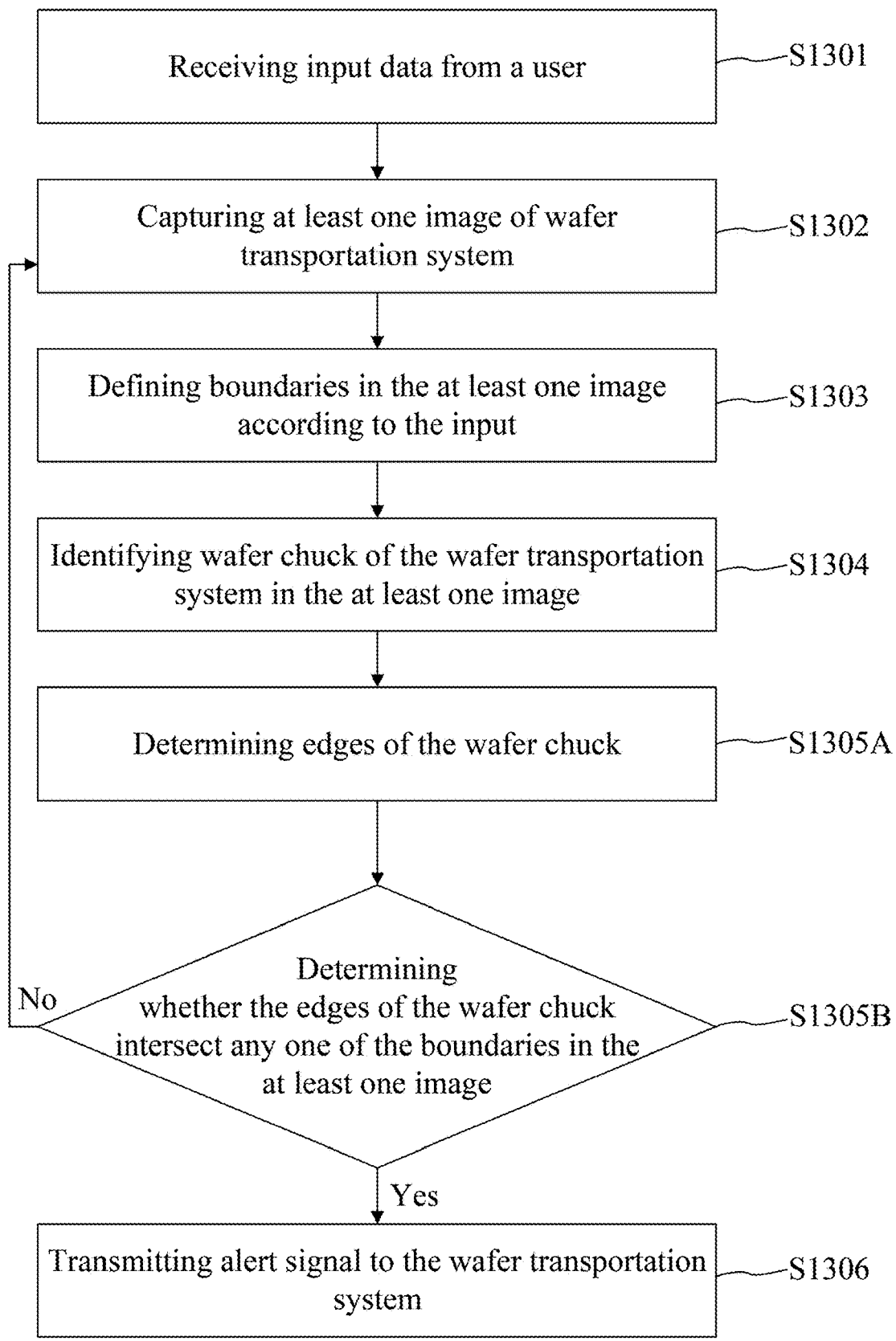

Some embodiments of the present disclosure include an alert method, and flowchart diagrams thereof are shown in FIGS. 13A and 13B. The alert method of some embodiments is for use in an alert device (e.g., the alert device of the aforesaid embodiments). The alert device may include an image capturing unit, a processing unit and an input/output unit. Detailed steps of the alert method are described below.

Operation S1301 is executed to receive, by an input/output unit, an input data from a user. The input data may include some parameters for defining boundaries in the captured images. Operation S1302 is executed to capture, by the image capturing unit, at least one image of a wafer transportation system.

Operation 51303 is executed to define, by the processing unit, boundaries in the at least one image. Operation S1304 is executed to identify, by the processing unit, a wafer chuck of the wafer transportation system in the at least one image. Operation S1305 is executed to determine, by the processing unit, whether the wafer chuck intersects any of the boundaries in the at least one image.

If the wafer chuck is determined to intersect one of the boundaries in the at least one image, operation S1306 is executed to transmit, by the processing unit, an alert signal to the wafer transportation system via the input/output unit, so as to make the wafer transportation system stop transporting the wafer chuck. If the wafer chuck is determined to not intersect any of the boundaries in the at least one image, operation S1302 is repeated.

In some embodiments, operation S1305 may include two sub-operations S1305A and S1305B. Operation S1305A is executed to determine, by the processing unit, edges of the wafer chuck. Operation S1305B is executed to determine, by the processing unit, whether the edges of the wafer chuck intersect any of the boundaries in the at least one image.

If the edges of the wafer chuck are determined to intersect one of the boundaries in the at least one image, operation S1306 is executed. If the edges of the wafer chuck are determined not to intersect any of the boundaries in the at least one image, operation S1302 is repeated.

In some embodiments, one of the boundaries may include a first line in a first direction and a second line in a second direction. The first direction and the second direction may be different. In some embodiments, the wafer chuck of the wafer transportation system in the at least one image may be identified according to a mark, a color or a shape of the wafer chuck.

It shall be particularly appreciated that the processing unit mentioned in the above embodiments may include a central processing unit (CPU), other hardware circuit elements capable of executing relevant instructions, or a combination of computing circuits that are well-known to those skilled in the art based on the above disclosures.

Moreover, the input/output unit mentioned in the above embodiments may include a network interface for transmitting a signal to the wafer transportation system. The network interface may be a combination of a network data transmitter and a network data receiver. The input/out unit may include a human interface device for receiving input data from a user.

Further, the communication buses mentioned in the above embodiments may include a communication interface for transferring data between the elements, such as the image capturing unit, the processing unit and the input/output unit, and may include an electrical bus interface, an optical bus interface or even a wireless bus interface. However, such description is not intended to limit the hardware implementation embodiments of the present disclosure.

One aspect of the present disclosure provides an alert device, including an image capturing unit, an input/output unit and a processing unit. The image capturing unit is configured to capture at least one image of a wafer transportation system. The input/output unit is configured to communicate with the wafer transportation system. The processing unit is connected to the input/output unit and the image capturing unit electrically, and configured to: retrieve the at least one image from the image capturing unit; define a first boundary in the at least one image; identify a wafer chuck of the wafer transportation system in the at least one image; determine whether the wafer chuck intersects the first boundary in the at least one image; and transmit an alert signal to the wafer transportation system via the input/output unit when the wafer chuck is determined to intersect the first boundary in the at least one image.

Another aspect of the present disclosure provides an alert device, including an image capturing unit, an input/output unit and a processing unit. The image capturing unit is configured to capture at least one image of a monitor, wherein the monitor displays a wafer transportation system and a first boundary. The input/output unit is configured to communicate with the wafer transportation system. The processing unit is connected to the input/output unit and the image capturing unit electrically, and configured to: retrieve the at least one image from the image capturing unit; identify a wafer chuck of the wafer transportation system and the first boundary in the at least one image; determine whether the wafer chuck intersects the first boundary in the at least one image; and transmit an alert signal to the wafer transportation system via the input/output unit when the wafer chuck is determined to intersect the first boundary in the at least one image.

Another aspect of the present disclosure provides an alert method, including: capturing, by an image capturing unit, at least one image of a wafer transportation system; defining, by a processing unit, a first boundary in the at least one image; identifying, by the processing unit, a wafer chuck of the wafer transportation system in the at least one image; determining, by the processing unit, whether the wafer chuck intersects the first boundary in the at least one image; and transmitting, by the processing unit, an alert signal to the wafer transportation system via an input/output unit communicating with the wafer transportation system when the wafer chuck is determined to intersect the first boundary in the at least one image.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. An alert device, comprising:
    an image capturing unit, being configured to capture at least one image of a wafer transportation system;

an input/output unit, being configured to communicate with the wafer transportation system;

a processing unit, being connected to the input/output unit and the image capturing unit electrically, and configured to:

retrieve the at least one image from the image capturing unit;

define a first boundary in the at least one image;

identify a wafer chuck of the wafer transportation system in the at least one image;

determine whether the wafer chuck intersects the first boundary in the at least one image; and transmit an alert signal to the wafer transportation system via the input/output unit when the wafer chuck is determined intersect the first boundary in the at least one image.

2. The alert device of claim 1, wherein the processing unit is further configured to:

define a second boundary in the at least one image;

determine whether the wafer chuck intersects the second boundary in the at least one image; and transmit the alert signal to the wafer transportation system via the input/output unit when the wafer chuck is determined intersect the second boundary in the at least one image.

3. The alert device of claim 1, wherein determining whether the wafer chuck intersects the first boundary in the at least one image further comprises:

determining edges of the wafer chuck; and determining whether the edges of the wafer chuck intersect the first boundary in the at least one image.

4. The alert device of claim 1, wherein the first boundary includes a first line in a first direction and a second line in a second direction which is different from the first direction.

5. The alert device of claim 1, wherein identifying the wafer chuck of the wafer transportation system in the at least one image further comprises:

identifying the wafer chuck of the wafer transportation system in the at least one image according to a mark, a color or a shape of the wafer chuck.

6. The alert device of claim 1, wherein the input/output unit is further configured to receive an input data from a user, and the first boundary is defined according to the input data.

7. The alert device of claim 1, wherein the alert signal is used to stop the wafer transportation system from transporting the wafer chuck.

8. An alert device, comprising:

an image capturing unit, being configured to capture at least one image of a monitor, wherein the monitor displays a wafer transportation system and a first boundary;

an input/output unit, being configured to communicate with the wafer transportation system;

a processing unit, being connected to the input/output unit and the image capturing unit electrically, and configured to:

retrieve the at least one image from the image capturing unit;

identify a wafer chuck of the wafer transportation system and the first boundary in the at least one image;

determine whether the wafer chuck intersects the first boundary in the at least one image; and transmit an alert signal to the wafer transportation system via the input/output unit when the wafer chuck is determined intersecting the first boundary in the at least one image.

9. The alert device of claim 8, wherein the monitor further displays a second boundary, and the processing unit is further configured to:

identify the second boundary in the at least one image;

determine whether the wafer chuck intersects the second boundary in the at least one image; and transmit the alert signal to the wafer transportation system via the input/output unit when the wafer chuck is determined intersect the second boundary in the at least one image.

10. The alert device of claim 8, wherein determining whether the wafer chuck intersects the first boundary in the at least one image further comprises:

determining edges of the wafer chuck; and determining whether the edges of the wafer chuck intersect the first boundary in the at least one image.

11. The alert device of claim 8, wherein the first boundary includes a first line in a first direction and a second line in a second direction which is different from the first direction.

12. The alert device of claim 8, wherein identifying the wafer chuck of the wafer transportation system in the at least one image further comprises:

identifying the wafer chuck of the wafer transportation system in the at least one image according to a mark, a color or a shape of the wafer chuck.

13. The alert device of claim 8, wherein the alert signal is used to stop the wafer transportation system from transporting the wafer chuck.

14. An alert method, comprising:

capturing, by an image capturing unit, at least one image of a wafer transportation system;

defining, by a processing unit, a first boundary in the at least one image;

identifying, by the processing unit, a wafer chuck of the wafer transportation system in the at least one image;

determining, by the processing unit, whether the wafer chuck intersects the first boundary in the at least one image; and transmitting, by the processing unit, an alert signal to the wafer transportation system via an input/output unit communicating with the wafer transportation system when the wafer chuck is determined intersect the first boundary in the at least one image.

15. The alert method of claim 14, further comprising:

defining, by the processing unit, a second boundary in the at least one image;

determining, by the processing unit, whether the wafer chuck intersects the second boundary in the at least one image; and transmitting, by the processing unit, the alert signal to the wafer transportation system via the input/output unit when the wafer chuck is determined intersect the second boundary in the at least one image.

16. The alert method of claim 14, wherein determining whether the wafer chuck intersects the first boundary in the at least one image further comprises:

determining, by the processing unit, edges of the wafer chuck; and determining, by the processing unit, whether the edges of the wafer chuck intersect the first boundary in the at least one image.

17. The alert method of claim 14, wherein the first boundary includes a first line in a first direction and a second line in a second direction which is different from the first direction.

18. The alert method of claim 14, wherein identifying the wafer chuck of the wafer transportation system in the at least one image further comprises:
- identifying, by the processing unit, the wafer chuck of the wafer transportation system in the at least one image according to a mark, a color or a shape of the wafer chuck.

19. The alert method of claim 14, further comprising:
receiving, by the input/output unit, an input data from a user;
- wherein the first boundary is defined according to the input data.

20. The alert method of claim 14, wherein the alert signal is used to stop the wafer transportation system from transporting the wafer chuck.

* * * * *